(12) United States Patent
Marsden et al.

(10) Patent No.: US 11,740,367 B2
(45) Date of Patent: Aug. 29, 2023

(54) RADIATION DETECTORS FOR SCANNING SYSTEMS, AND RELATED SCANNING SYSTEMS

(71) Applicant: Analogic Corporation, Peabody, MA (US)

(72) Inventors: Lane Marsden, Peabody, MA (US); Randy Luhta, Peabody, MA (US)

(73) Assignee: Analogic Corporation, Peabody, MA (US)

( * ) Notice: Subject to any disclaimer, the term of this patent is extended or adjusted under 35 U.S.C. 154(b) by 101 days.

(21) Appl. No.: 17/571,262

(22) Filed: Jan. 7, 2022

(65) Prior Publication Data
US 2023/0221452 A1    Jul. 13, 2023

(51) Int. Cl.
*G01T 1/20* (2006.01)
*H01L 27/146* (2006.01)
*G01T 7/00* (2006.01)

(52) U.S. Cl.
CPC ............ *G01T 1/20188* (2020.05); *G01T 7/00* (2013.01); *H01L 27/1469* (2013.01); *H01L 27/14623* (2013.01); *H01L 27/14661* (2013.01); *H01L 27/14663* (2013.01); *H01L 27/14685* (2013.01)

(58) Field of Classification Search
CPC . G01T 1/20188; G01T 7/00; H01L 27/14623; H01L 27/14661; H01L 27/14663; H01L 27/14685; H01L 27/1469
See application file for complete search history.

(56) References Cited

U.S. PATENT DOCUMENTS

| | | | |
|---|---|---|---|
| 4,362,946 A | 12/1982 | Cusano et al. | |
| 6,510,195 B1 | 1/2003 | Chappo et al. | |
| 7,112,799 B2 | 9/2006 | Vogtmeier | |
| 2004/0183789 A1 | 9/2004 | Schopf | |
| 2012/0132817 A1 | 5/2012 | Shaw et al. | |
| 2013/0032389 A1* | 2/2013 | Tokura .............. | H01L 27/14661 174/264 |
| 2013/0327947 A1 | 12/2013 | Ronda et al. | |
| 2014/0361181 A1 | 12/2014 | Liu | |
| 2017/0307766 A1 | 10/2017 | Abenaim et al. | |
| 2020/0393581 A1 | 12/2020 | Luhta et al. | |

FOREIGN PATENT DOCUMENTS

| | | |
|---|---|---|
| CN | 1532522 A | 9/2004 |
| CN | 102870006 A | 1/2013 |
| EP | 2560027 A1 | 2/2013 |

(Continued)

*Primary Examiner* — Kiho Kim
(74) *Attorney, Agent, or Firm* — TraskBritt

(57) ABSTRACT

A radiation scanning system comprises a radiation detection sub-assembly, and a routing sub-assembly coupled to the radiation detection sub-assembly. The radiation detection sub-assembly comprises a first substrate electrically connected to the radiation detection sub-assembly, and a second substrate electrically connected to the first substrate. The radiation scanning system further comprises one or more radiation shields between the first substrate and the second substrate, and one or more semiconductor dice electrically connected to the second substrate on a side of the second substrate opposite the first substrate. Related radiation detector arrays radiation scanning systems are also disclosed.

20 Claims, 16 Drawing Sheets

(56) References Cited

FOREIGN PATENT DOCUMENTS

| JP | 2009-032936 A | 2/2009 |
|----|---------------|--------|
| JP | 2009-074964 A | 4/2009 |
| JP | 2009-076726 A | 4/2009 |
| WO | 2004/027454 A1 | 4/2004 |
| WO | 2014/027454 A1 | 2/2014 |

* cited by examiner

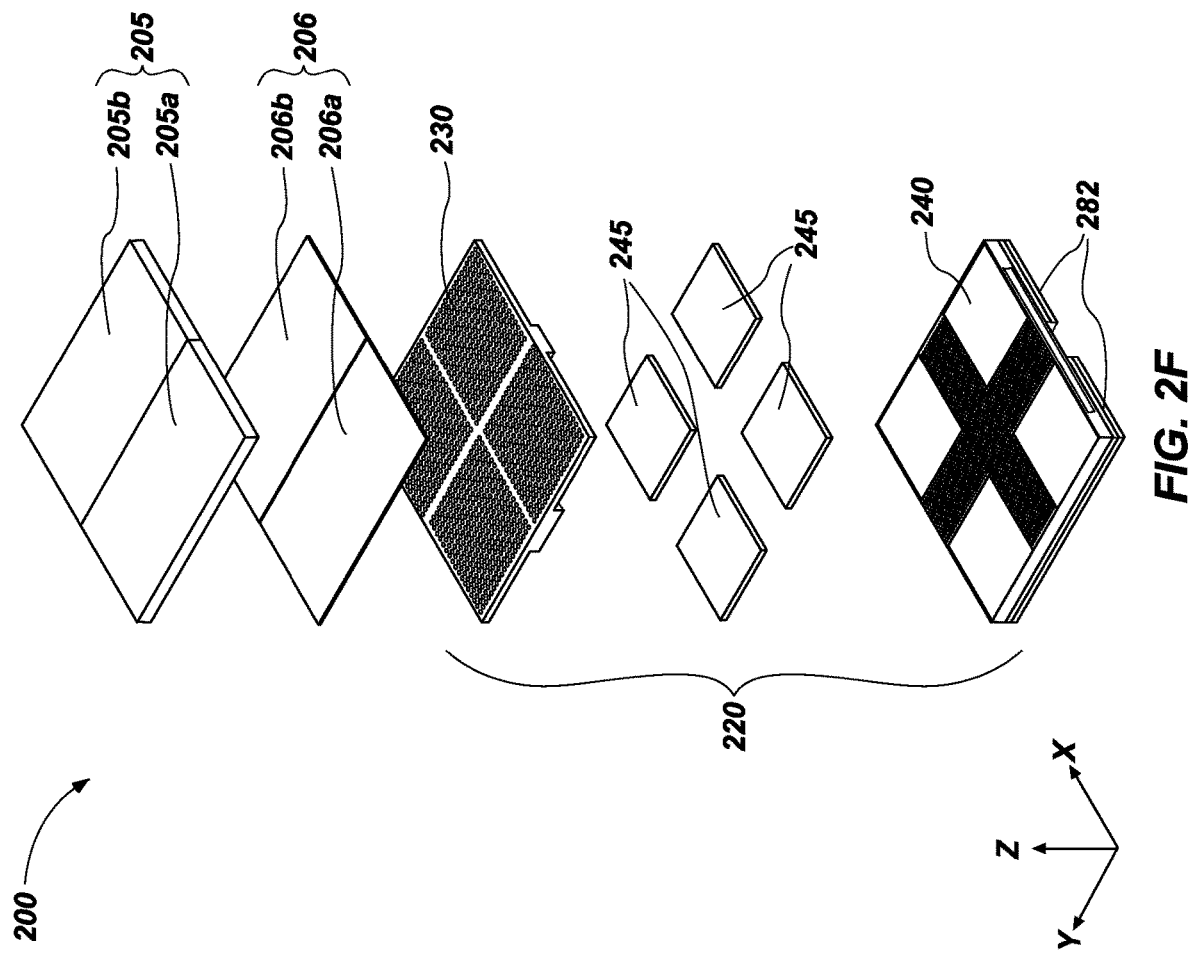

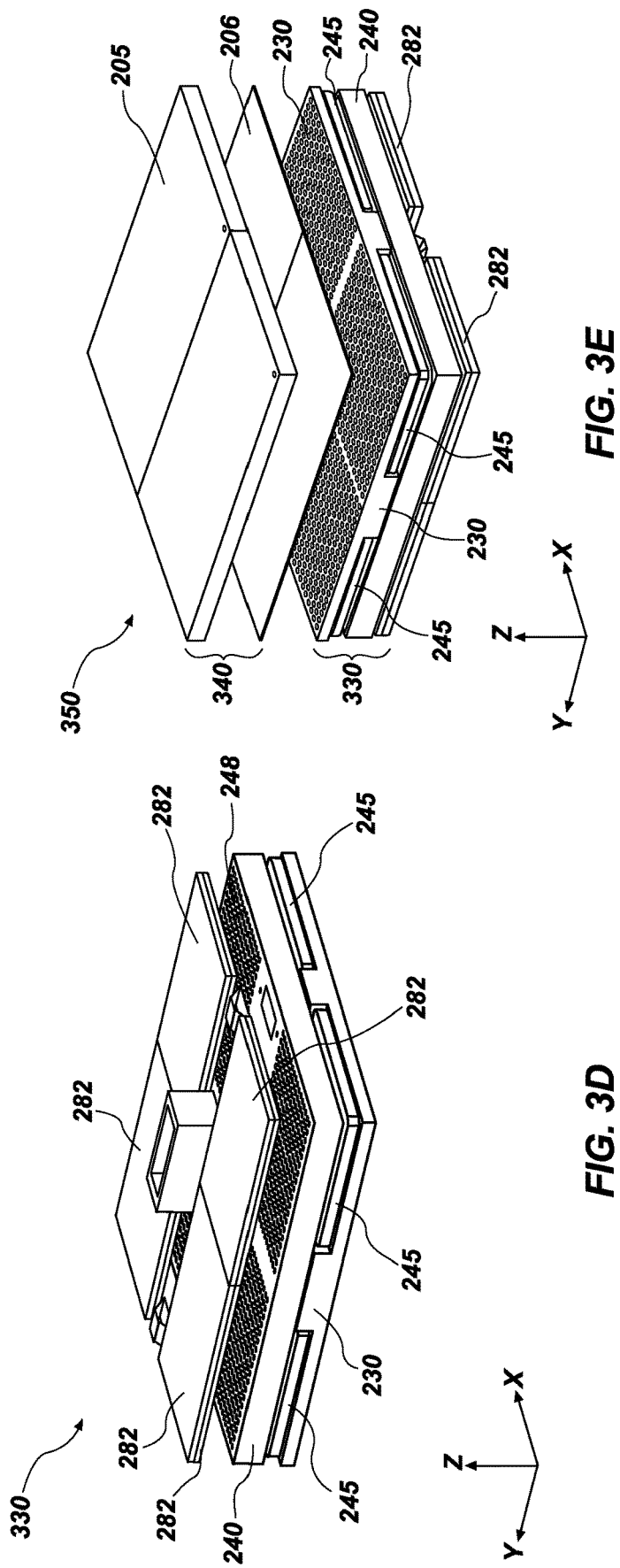

RADIATION DETECTORS FOR SCANNING SYSTEMS, AND RELATED SCANNING SYSTEMS

FIELD

Embodiments of the disclosure relate generally to radiation detectors for scanning systems. More particularly, embodiments of the disclosure relate to a radiation system including one or more radiation detector arrays, the radiation detector arrays individually including one or more radiation shields between substrates of a routing sub-assembly, and to related scanning systems.

BACKGROUND

Radiation imaging modalities such as computed tomography (CT) systems, single-photon emission computed tomography (SPECT) systems, digital projection systems, line-scan systems, and/or positron emission tomography (PET), for example, are useful to provide information, or images, of interior aspects of an object under examination. In transmission imaging modalities, such as CT, the object is exposed to radiation comprising photons (e.g., such as x-rays, gamma rays, without limitation), and an image(s) is formed based upon the radiation absorbed and/or attenuated by the interior aspects of the object, or rather a number of radiation photons that are able to pass through the object. Generally, highly dense aspects of the object absorb and/or attenuate more radiation than less dense aspects, and thus an aspect having a higher density, such as a bone or metal, for example, will be apparent when surrounded by less dense aspects, such as muscle or clothing. Emission imaging modalities such as SPECT and PET form image(s) based on the radiation emitted from a radioactive tracer that provides functional information of an object.

Radiation systems generally comprise one or more radiation sources (e.g., an x-ray source, gamma-ray source) and a detector array. The detector array comprises, among other things, a radiation detection sub-assembly and an electronic sub-assembly. Radiation photons that pass through an object impinge a surface of one or more detector elements (also referred to as "detector cells") of the radiation detection sub-assembly. The one or more detector elements typically directly or indirectly generate electrical charge in response to the impinging radiation photons.

The detector array typically comprises a plurality of detector elements, respectively configured to convert detected radiation into electric signals. A magnitude of attenuation by an object in an examination region is inversely related to an amount or rate of electrical charge generated by a detector element. Based upon the number of radiation photons detected by respective detector elements and/or the electrical charge generated by respective detector elements between samplings, images can be reconstructed that are indicative of the density, z-effective (also referred to as the effective atomic number), shape, and/or other properties of the object and/or aspects thereof. The electronics sub-assembly is configured to readout electrical charge that has accumulated within the radiation detector sub-assembly and/or digitize an analog signal generated from the readout. While the radiation detection sub-assembly converts most of the radiation impingement thereon into electrical charge, a small percentage of the radiation that impinges the radiation detection sub-assembly traverses the radiation detection sub-assembly and is incident upon the electronics sub-assembly. However, the interaction of radiation with the electronics sub-assembly may damage the electronics sub-assembly and/or shorten a lifespan of electronics disposed therein, for example.

SUMMARY

In accordance with some embodiments of the disclosure, a radiation scanning system comprises a radiation detection sub-assembly, and a routing sub-assembly coupled to the radiation detection sub-assembly. The radiation detection sub-assembly comprises a first substrate electrically connected to the radiation detection sub-assembly, and a second substrate electrically connected to the first substrate. The radiation scanning system further comprises one or more radiation shields between the first substrate and the second substrate, and one or more semiconductor dice electrically connected to the second substrate on a side of the second substrate opposite the first substrate.

In accordance with other embodiments of the disclosure, a detector array for a radiation system comprises a first substrate coupled to a radiation detection sub-assembly, a second substrate vertically underlying the first substrate, conductive structures between the first substrate and the second substrate and electrically connecting the first substrate and the second substrate, and one or more radiation shields within one or more cavities between the first substrate and the second substrate.

In accordance with additional embodiments of the disclosure, a radiation scanning system comprises a radiation detection sub-assembly comprising a scintillator array, and a photodiode array coupled to the scintillator array. The radiation scanning system further comprises a routing sub-assembly comprising a first substrate coupled to the photodiode array with first conductive structures, the first substrate comprising a protrusion extending in a direction opposite the photodiode array, a second substrate coupled to the first substrate with second conductive structures, and one or more radiation shields between the first substrate and the second substrate, the one or more radiation shields laterally spaced from the protrusion. The radiation scanning system further comprises an electronics sub-assembly comprising one or more semiconductor dice coupled to the second substrate with third conductive structures, and a connector configured to electrically couple to a detector module.

BRIEF DESCRIPTION OF THE SEVERAL VIEWS OF THE DRAWINGS

FIG. 2F is an exploded perspective view of the detector tile;

FIG. 3B through FIG. 3E are simplified perspective views illustrating a method of forming the detector tile of FIG. 2A, in accordance with embodiments of the disclosure;

FIG. 9A and FIG. 9B are simplified partial cross-sectional view of application specific integrated circuit (ASIC) packages, in accordance with embodiments of the disclosure.

DETAILED DESCRIPTION

Figure 1:
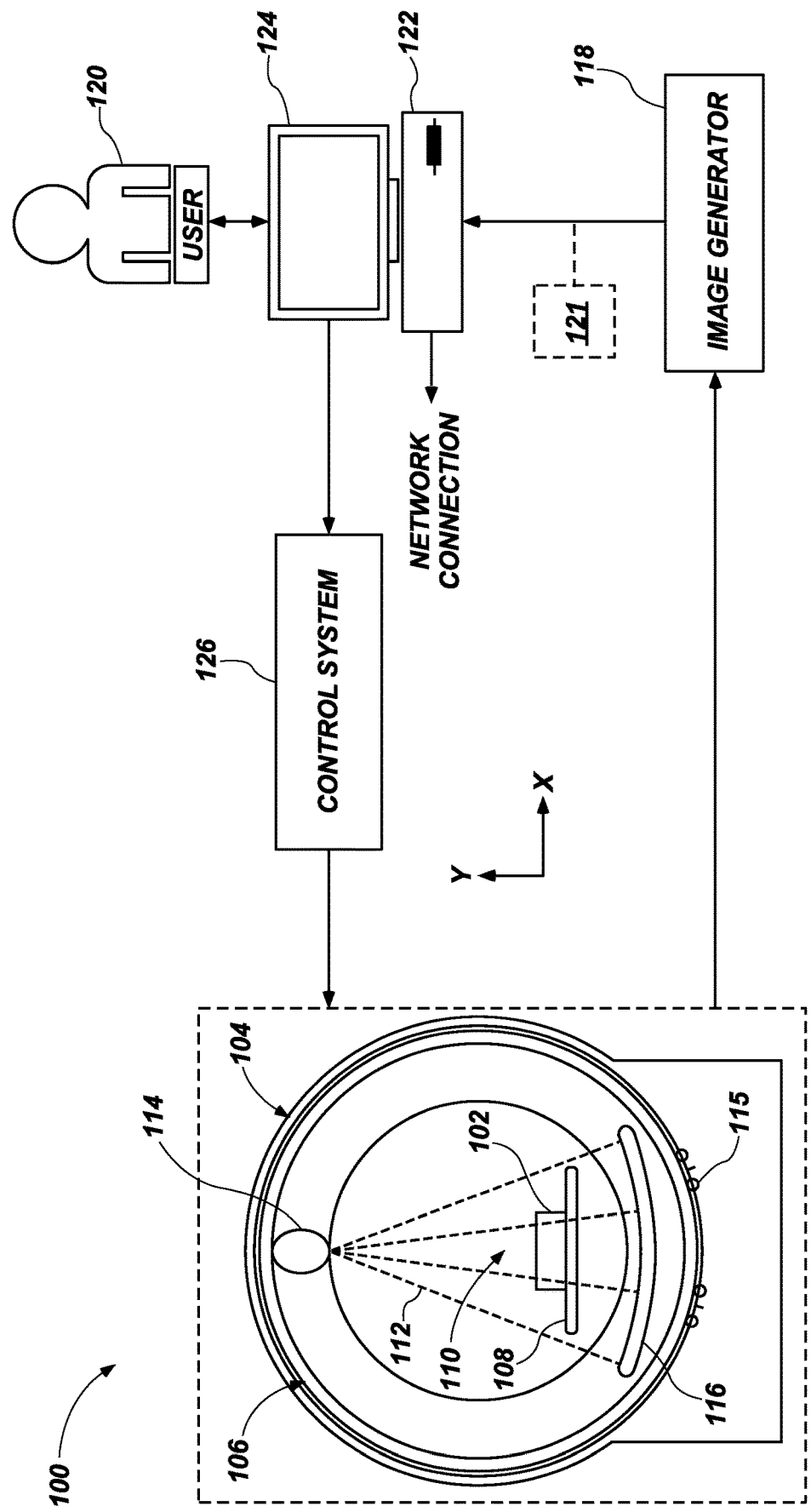
FIG. 1 is a schematic of a scanning system to perform transmission radiation-based scanning, in accordance with embodiments of the disclosure.

The illustrations presented in this disclosure are not meant to be actual views of any particular scanning system for performing radiation-based (e.g., computed tomography (CT)) scanning or component thereof or component thereof, but are merely idealized representations employed to describe illustrative embodiments. Thus, the drawings are not necessarily to scale.

The following description provides specific details, such as material types, dimensions, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete apparatus or system for a scanning system including a detector array comprising detector elements. Only those process acts and structures necessary to understand the embodiments of the disclosure are described in detail below. Also note, any drawings accompanying the present application are for illustrative purposes only, and are thus not drawn to scale. Additionally, elements common between figures may retain the same numerical designation.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the term "configured" refers to a size, shape, material composition, orientation, and arrangement of one or more of at least one structure and at least one apparatus facilitating operation of one or more of the structures and the apparatus in a predetermined way.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.). As used herein, "each" means some or a totality. As used herein, "each and every" means a totality.

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

In this description the term "coupled" and derivatives thereof may be used to indicate that two elements co-operate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present. The terms "on" and "connected" may be used in this description interchangeably with the term "coupled," and have the same meaning unless expressly indicated otherwise or the context would indicate otherwise to a person having ordinary skill in the art.

According to embodiments disclosed herein, a radiation scanning system is configured to inspect translated objects using radiation-based scanning. More specifically, disclosed are embodiments of radiation detector arrays, each comprising a radiation detection sub-assembly, an electronics sub-assembly, and a routing sub-assembly between the radiation detection sub-assembly and the electronics sub-assembly. The routing sub-assembly includes a first substrate electrically connected to a second substrate and one or more radiation shields between the first substrate and the second substrate, the one or more radiation shields configured to shield (e.g., block) an amount of radiation passing therethrough, and attenuate impingent radiation to reduce an amount of radiation passing therethrough to one or more components of the electronics sub-assembly. In other words, the one or more radiation shields may at least partially protect one or more components of the electronics sub-assembly from impingement radiation. The first substrate and the second substrate include electrical connections and electrical routing for routing electronic signals from the radiation detection sub-assembly through the routing sub-assembly and to the electronics sub-assembly. The routing sub-assembly may facilitate formation of the components of the electronics sub-assembly in a package assembly (as opposed to as a bare semiconductor die). The size and shape of the first substrate and the second substrate facilitates an increased thickness of the one or more radiation shields and a density of electrical interconnects between the first substrate and the second substrate.

FIG. 1 is a schematic of a scanning system 100 to perform transmission radiation-based (e.g., CT) scanning, in accordance with embodiments of the disclosure. Techniques in accordance with this disclosure may find applicability with, for example, CT systems, diffraction systems, and/or other systems comprising other radiation imaging modalities and other radiation detector systems. For example, the scanning system 100 may be useful with line-scan systems, digital projection systems, diffraction systems, and other systems configured to detect radiation.

The scanning system 100 may be configured to examine one or more objects 102 (e.g., a human subject, a series of suitcases at an airport, freight, parcels, without limitation). The scanning system 100 may include, for example, a stator 104 and a rotor 106 rotatable relative to the stator 104. During examination, the object(s) 102 may be located on a support 108, such as, for example, a bed, roller conveyor, or conveyor belt, that is selectively positioned in an examination region 110 (e.g., a hollow bore in the rotor 106 in which the object(s) 102 is exposed to radiation 112), and the rotor 106 may be rotated about the object(s) 102 by a motivator 115 (e.g., motor, drive shaft, chain, without limitation).

The rotor 106 may surround a portion of the examination region 110 and may be configured as, for example, a gantry supporting at least one radiation source 114 (e.g., an ionizing x-ray source, gamma-ray source, without limitation), the at least one radiation source 114 oriented to emit the radiation 112 toward the examination region 110 and at least one radiation detector 116 supported on a substantially diametrically opposite side of the examination region 110 (which may also be a substantially diametrically opposite side of rotor 106) relative to the radiation source(s) 114. During a contemplated examination of object(s) 102 by the scanning system 100, the radiation source(s) 114 emits fan and/or cone shaped radiation 112 configurations toward the examination region 110. The radiation 112 may be emitted, for example, at least substantially continuously or intermittently (e.g., a pulse of radiation 112 followed by a resting period during which the radiation source(s) 114 is not activated).

As the emitted radiation 112 traverses the examination region 110 and the object(s) 102, the radiation 112 may be attenuated differently by different aspects of the object(s) 102. Because different aspects attenuate different amounts (e.g., percentages, without limitation) of the radiation 112, an image or images can be generated based upon the attenuation, or variations in the number of radiation photons that are detected by the radiation detector 116. As non-limiting examples, more dense aspects of the object(s) 102, such as an inorganic material, may attenuate more of the radiation 112 than less dense aspects, such as organic materials, causing fewer photons to be detected by the radiation detector 116. As another non-limiting example, more dense regions of the object(s) 102, such as bone or a metal plate may attenuate more of the radiation 112 than less dense aspects, such as skin or clothing, causing fewer photons to be detected by the radiation detector 116.

The radiation detector 116 may include, for example, many individual detector tiles arranged in a pattern (e.g., a row or an array) on one or more detection assemblies (also referred to as detection modules, detector modules, and/or the like), which are operatively connected to one another to form the radiation detector 116, which may comprise a so-called detector measurement system (DMS). Each detector tile may include one or more arrays of detectors elements arranged in a pattern (e.g., rows and columns). In some embodiments, the detector elements may be configured to indirectly convert (e.g., using a scintillator array and photodetectors) detected radiation into analog signals. In other embodiments, the detector elements are configured to directly convert the detected radiation into analog signals. Further, the radiation detector 116, or detection assemblies thereof, may include electronic circuitry, such as, for example, an analog-to-digital (A/D) converter, configured to filter the analog signals, digitize the analog signals, and/or otherwise process the analog signals and/or digital signals generated thereby. Digital signals output from the electronic circuitry may be conveyed from the radiation detector 116 to digital processing components configured to store data associated with the digital signals and/or further process the digital signals.

In some embodiments, the digital signals may be transmitted to an image generator 118 configured to generate image space data, also referred to as images, from the digital signals using a suitable analytical, iterative, and/or other reconstruction technique (e.g., backprojection reconstruction, tomosynthesis reconstruction, iterative reconstruction, without limitation). In this way, the data may be converted from projection space to image space, a domain that may be more understandable by a user 120 viewing the image(s), as a non-limiting example. Such image space data may depict a two dimensional representation of the object(s) 102 and/or a three dimensional representation of the object(s) 102. In other embodiments, the digital signals may be transmitted to other digital processing components, such as a threat analysis component 121, for processing and, optionally, generation of an alert or augmentation of such image space data with additional information for the user (e.g., with indications of a detected threat or areas of interest, without limitation) in response to such processing.

The illustrated scanning system 100 may also include a terminal 122 (e.g., a workstation or other computing device), configured to receive the image(s), which can be displayed on a monitor 124 to the user 120 (e.g., security personnel, medical personnel, without limitation). In this way, the user 120 can inspect the image(s) to identify areas of interest within the object(s) 102. The terminal 122 may also be configured to receive user input which may direct operations of the scanning system 100 (e.g., a rate at which the support 108 moves, activation of the radiation source(s) 114, without limitation) and connected to additional terminals 122 through a network connection (e.g., a local area network or the Internet, without limitation).

A control system 126 may be coupled (e.g., operably coupled) to the terminal 122. The control system 126 may be configured to automatically control at least some operations of the scanning system 100. For example, the control system 126 may be configured to directly and/or indirectly, automatically, and dynamically control the rate at which the support 108 moves through the examination region 110, the rate at which the rotor 106 rotates relative to the stator 104, activation, deactivation, and output level of (e.g., intensity of radiation emitted by) the radiation source(s) 114, or any combination or subcombination of these and/or other operating parameters. In some embodiments, the control system 126 may also accept manual override instructions from the terminal 122 and issue instructions to the scanning system 100 to alter the operating parameters of the scanning system 100 based on the manual override instructions. The control system 126 may be located proximate to a remainder of the scanning system 100 (e.g., integrated into the same housing or within the same room as the remaining components) or may be distal from the scanning system 100 (e.g., located in another room, such as, for example, an on-site control room, an off-site server location, a cloud storage system). The control system 126 may be dedicated to control a single scanning system 100, or may control multiple scanning systems 100 in an operative grouping or subgrouping.

Figure 2A:
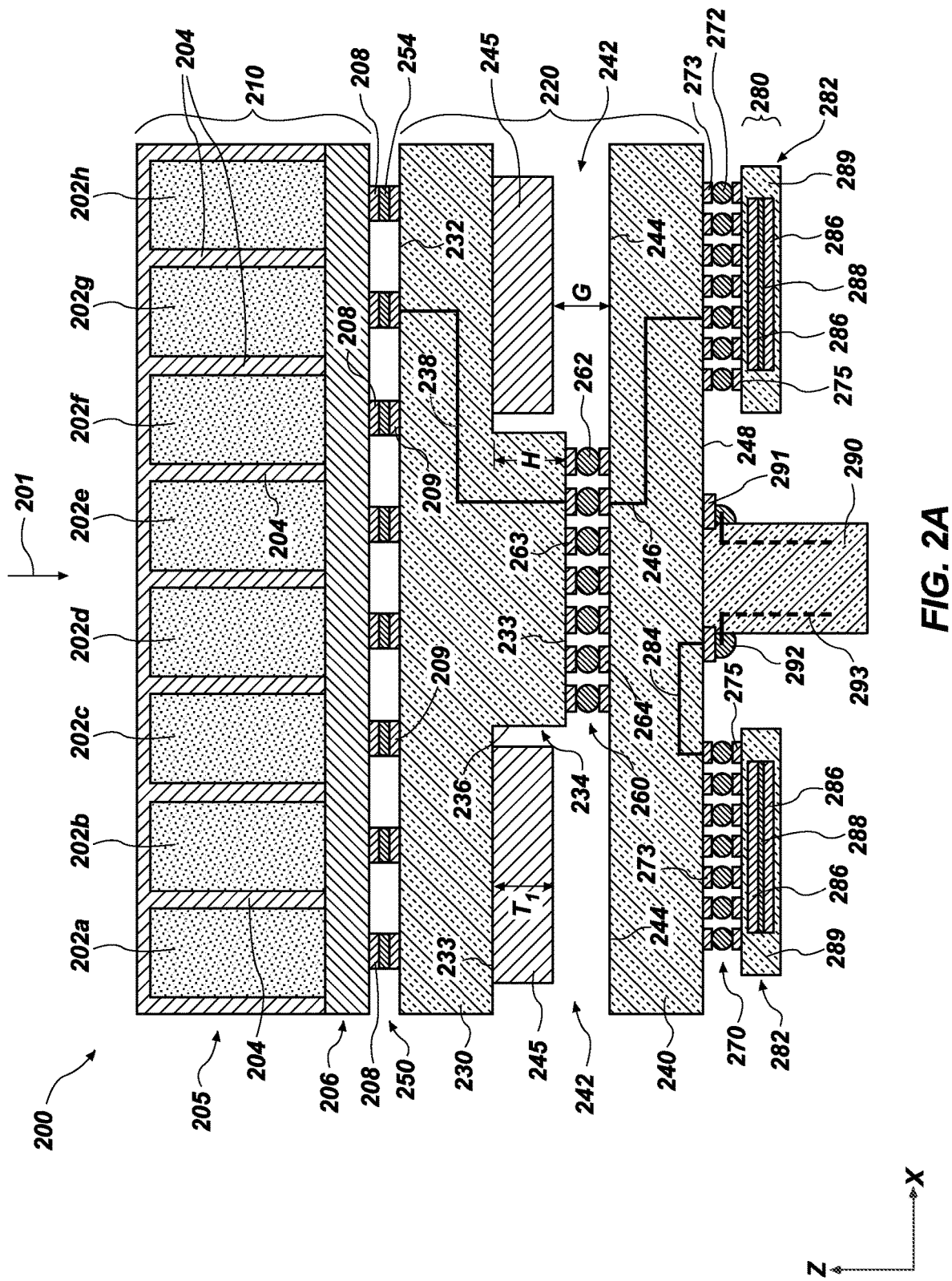
FIG. 2A is a simplified partial cross-sectional view of a detector tile, in accordance with embodiments of the disclosure.

FIG. 2A is a simplified partial cross-sectional view in the XZ plane of a detector tile 200 (also referred to as a "radiation detector tile"), in accordance with embodiments of the disclosure. The detector tile 200 may comprise a portion of the radiation detector 116 (FIG. 1) of the scanning system 100 (FIG. 1). The detector tile 200 comprises a radiation detection sub-assembly 210, an electronics sub-assembly 280, and a routing sub-assembly 220 vertically between the radiation detection sub-assembly 210 and the electronics sub-assembly 280. The routing sub-assembly 220 may be vertically between the radiation detection sub-assembly 210 and the electronics sub-assembly 280. The routing sub-assembly 220 may be configured to route (e.g., convey) signals (e.g., low-level analog signals) between the radiation detection sub-assembly 210 and the electronics sub-assembly 280. The electronics sub-assembly 280 comprises one or more elements configured to process the signals (e.g., convert the analog signals to digital signals, filter the analog signals and/or digital signals respectively routed by the routing sub-assembly) from the radiation detection sub-assembly 210.

The radiation detection sub-assembly 210 comprises one or more detector elements (as depicted in FIG. 2A, a respective one of such detector elements includes a respective scintillator 202 and a portion of the photodetector array 206 vertically adjacent and coupled to the scintillator 202) and configured to detect radiation and/or generate analog signals indicative of detected radiation. In some embodiments, the radiation detection sub-assembly 210 is configured to convert detected radiation into analog signals. In some embodiments, the radiation detection sub-assembly 210 is configured to indirectly convert the radiation into electrical charge and comprises a scintillator array 205 and a photodetector array 206 (e.g., a photodiode array) directly vertically neighboring and contacting the scintillator array 205. The scintillator array 205 may be located in a radiation pathway 201 between the photodetector array 206 and the radiation source 114 (FIG. 1).

In other embodiments, rather than the scintillator array 205 and the photodiode array 206, the radiation detection sub-assembly 210 comprises a direct conversion material configured to directly convert radiation into electrical charge. The direct conversion material may comprise, among other things, cadmium zinc telluride (CZT), cadmium telluride (CdTe), or other materials configured to directly convert radiation photons, such as x-ray photons or gamma photons into electrical charge.

With continued reference to FIG. 2A, the scintillator array 205 comprises a plurality of scintillators 202a, 202b, 202c, 202d, 202e, 202f, 202g, 202h (collectively referred to as scintillators 202) configured to convert radiation photons impingent thereon into luminescent photons (e.g., in the visible or infrared wavelength spectrum). The scintillators 202 may correspond to a detector element (detector cell) of the detector tile 200. In some embodiments, neighboring scintillators 202 of the scintillator array 205 are spaced from each other by a gap (such a gap depicted in FIG. 2A as the space having the light-reflective material 204 therein).

Although FIG. 2A illustrates that the scintillator array 205 includes eight (8) scintillators 202, the disclosure is not so limited. In other embodiments, the scintillator array 205 comprises more than eight (8) scintillators 202, such as greater than or equal to sixteen (16) scintillators 202, greater than or equal to thirty-two (32) scintillators 202, greater than or equal to sixty-four (64) scintillators 202, greater than or equal to one hundred twenty-eight (128) scintillators 202, greater than or equal to two hundred fifty-six (256) scintillators 202, greater than or equal to five hundred twelve (512) scintillators 202, greater than or equal to one thousand twenty-four (1024) scintillators 202, or greater than or equal to two thousand forty-eight (2048) scintillators 202. In some embodiments, the scintillator array 205 comprises one thousand twenty-four (1024) scintillators 202. In some embodiments, the scintillator array 205 comprises two separate scintillator arrays 205, each comprising, for example five hundred twelve (512) scintillators 202 (e.g., two 16×32 scintillator arrays 205). In other embodiments, the scintillator array 205 comprises any desired number of arrays to generate a desired total number of scintillators 202.

The scintillators 202 may individually be formed of and include gadolinium oxysulfide (GOS), cadmium tungstate (CdWO$_4$, CWO), bismuth germanate (BGO) (Bi$_4$Ge$_3$O$_{12}$), cesium iodide (CsI), sodium iodide (NaI), lutetium orthosilicate (LSO) (Lu$_2$SiO$_5$, Lu$_4$O$_{12}$Si$_3$, H$_{12}$Lu$_4$O$_{12}$Si$_3$), or an amorphous material. In some embodiments, the scintillators 202 are individually formed of and include GOS.

In some embodiments, at least a portion of the gap between horizontally neighboring (e.g., in the X-direction, in the Y-direction) scintillators 202 of the scintillator array 205 may be filled with a light-reflective material 204 configured to reduce cross-talk between horizontally neighboring scintillators 202. The light-reflective material 204 may be disposed vertically (e.g., in the Z-direction) above the scintillators 202 and configured to reflect the radiation (e.g., light) vertically downwards in a direction of the photodetector array 206. The light-reflective material 204 may substantially surround the scintillators 202. In some embodiments, each scintillator 202 is surrounded by the light-reflective material on each horizontal (e.g., in the X-direction, in the Y-direction) side thereof and on a vertically (e.g., in the Z-direction) upper direction thereof. In some embodiments, a vertically lower surface of the scintillators 202 is contacted by the photodetector array 206. Accordingly, in some embodiments, the light-reflective material 204 surrounds first horizontal sides, second horizontal sides, and upper surfaces of each scintillator 202.

The photodetector array 206 comprises a plurality of photodetectors. The photodetectors may include back-illuminated photodiodes, front-illuminated photodiodes, or a combination thereof. The photodetectors may be configured to detect luminescent photons impinging thereon, may be configured to generate electrical charge responsive to detecting the luminescent photons, or both. The electrical charge may be periodically sampled (e.g., measured) to generate an analog signal, which is provided to the electronics sub-assembly 280 via the routing sub-assembly 220. Accordingly, the photodetectors of the photodetector array 206 are configured to generate an analog signal indicative of the number of luminescent photons detected by the photodetector between samplings (e.g., which corresponds to and correlates to the amount of radiation detected between samplings within a region of the scintillator array 205 proximate and corresponding to the sampled photodetector).

The photodetector array 206 includes bond pads 208 on a vertically (e.g., in the Z-direction) lower side thereof. In some embodiments, the bond pads 208 may be arranged on the lower side of the photodetector array 206 to correspond to the number and arrangement of photodetectors of the photodetector array 206. Stated another way, in some embodiments, each photodetector of the photodetector array 206 may independently be associated with one of the bond pads 208.

With continued reference to FIG. 2A, the routing sub-assembly 220 includes a first substrate 230 including bond pads 209 on an upper surface 232 thereof. The radiation detection sub-assembly 210 is coupled to the routing sub-assembly 220 by way of a first interconnection layer 250 comprising an electrically conductive adhesive (ECA) 254, such as an electrically conductive epoxy, electrically connecting the bond pads 208 of the photodetector array 206 to the bond pads 209 of the first substrate 230. The bond pads 209 on the first substrate 230 may correspond (e.g., in number and positioning) to the bond pads 208 of the photodiode array 206. The first interconnection layer 250 is configured to convey electrical signals from the radiation detection sub-assembly 210 (e.g., from the photodetector array 206) through the routing sub-assembly 220 to the electronics sub-assembly 280.

Although the first interconnection layer 250 has been described and illustrated as comprising the electrically conductive adhesive 254 coupling bond pads 208 of the photodiode array 206 to the bond pads 209 of the first substrate 230, the disclosure is not so limited. In other embodiments, the first interconnection layer 250 may include conductive structures (e.g., conductive balls, conductive bumps) electrically connected to the conductive pads of the photodetector array 206, and additional conductive pads on an upper surface of the routing sub-assembly 220. Accordingly, in some embodiments, the first interconnection layer 250 includes one or more of bond pads, solder balls, conductive epoxy, electrically conductive spring contacts, or other structures configured to form physical and electrical contact between the radiation detection sub-assembly 210 and the routing sub-assembly 220.

The bond pads 208 and the bond pads 209 may individually be formed of and include conductive material, such as, for example, one or more of a metal (e.g., tungsten, titanium, nickel, platinum, rhodium, ruthenium, aluminum, copper, molybdenum, iridium, silver, gold), and a metal alloy. In some embodiments the bond pads 208 and the bond pads 209 individually comprise tungsten. In other embodiments, the bond pads 208 comprise copper. However, the disclosure is not so limited and the bond pads 208 and the bond pads 209 may individually comprise conductive materials other than those described.

The routing sub-assembly 220 is located vertically (e.g., in the Z-direction) below the radiation detection sub-assembly 210 and the first interconnection layer 250. In some embodiments, the radiation detection sub-assembly 210 is located between the radiation pathway 201 and the routing sub-assembly 220 such that radiation passes through the radiation detection sub-assembly 210 (a majority of which is converted to electrical signals) prior to passing through the routing sub-assembly 220.

The routing sub-assembly 220 comprises the first substrate 230 (also referred to as a "top substrate" or an "upper substrate"), a second substrate 240 (also referred to as a "bottom substrate" or a "lower substrate") in electrical communication with the first substrate 230, and one or more radiation shields 245 between the first substrate 230 and the second substrate 240.

Figure 2C:
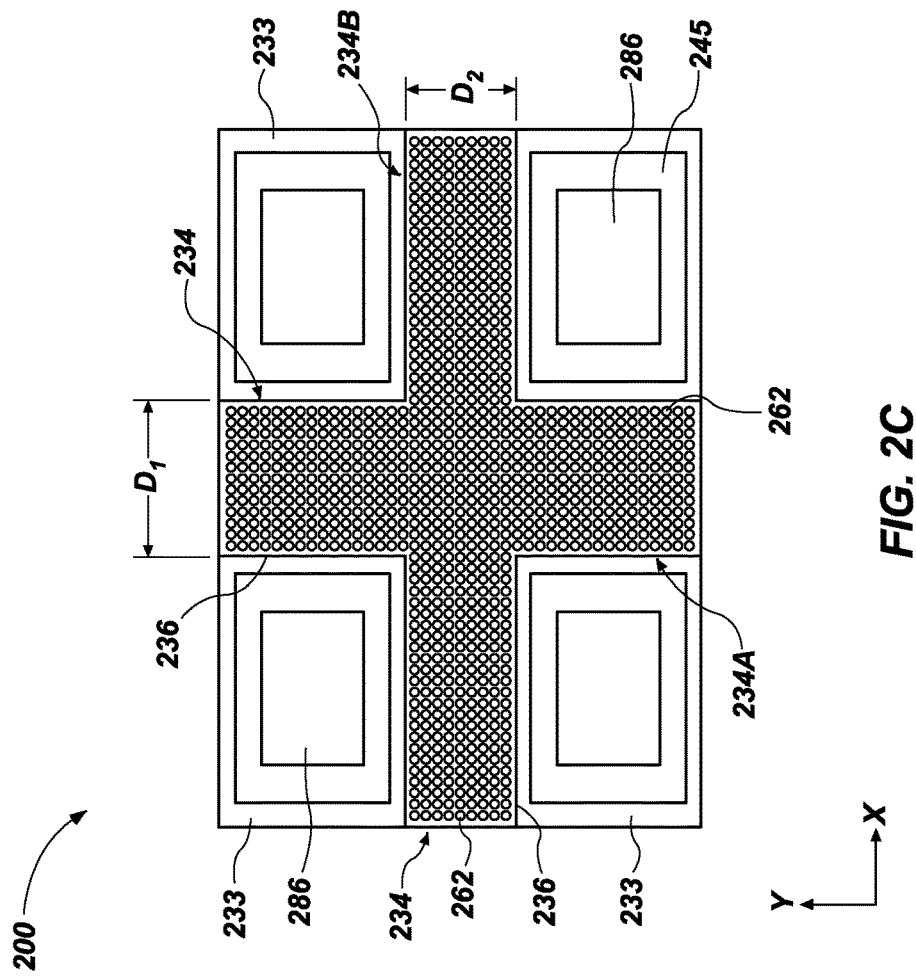
FIG. 2C is a simplified planar view of the detector tile of FIG. 2A.
Figure 2B:
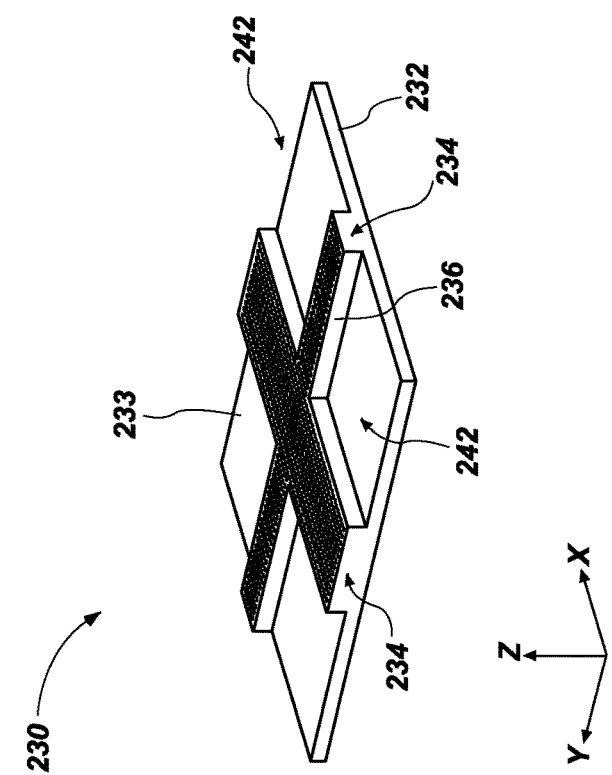
FIG. 2B is a simplified perspective view of a first substrate of the detector tile of FIG. 2A.

FIG. 2B is a simplified partial perspective view of the first substrate 230 and FIG. 2C is a simplified partial planar view of the detector tile 200 illustrating various components thereof, in accordance with embodiments of the disclosure. To more clearly illustrate components of the first substrate 230, the first substrate 230 is vertically inverted in FIG. 2B with respect to the orientation of the first substrate 230 in FIG. 2A. In FIG. 2C, although different components may not be located in the same vertical plane (e.g., in the XY plane), they are illustrated in FIG. 2C to illustrate the relative position and orientation of the components of the detector tile 200.

With combined reference to FIG. 2A through FIG. 2C, the first substrate 230 comprises a substantially planar upper surface 232 in contact with and coupled to the first interconnection layer 250 and a lower surface 233 including and partially defining a protruding portion 234 (also referred to as a "raised portion") extending towards the second substrate 240 such that surfaces of the first substrate 230 and surfaces of the second substrate 240 define one or more cavities 242 in which the radiation shields 245 are disposed.

With reference to FIG. 2B and FIG. 2C, in some embodiments, the protruding portion 234 exhibits a cross-shape. In other embodiments, the protruding portion 234 exhibits another shape, such as a square shape with one or more square-shaped openings in the middle thereof, a rectangular shape with one or more rectangular-shaped openings in the middle thereof. However, the disclosure is not so limited and the shape of the protruding portion 234 may be different than those described.

With continued reference FIG. 2C, in some embodiments, the protruding portion 234 may include a first portion 234A extending in a first horizontal direction (e.g., in the Y-direction) and a second portion 234B extending in a second horizontal direction (e.g., the X-direction) and intersecting the first portion 234A, such as proximate a horizontal center of the first substrate 230. In some embodiments, a horizontal dimension $D_1$ of the first portion 234A may be larger than a horizontal dimension $D_2$ of the second portion 234B. In other embodiments, the horizontal dimension $D_1$ of the first portion 234A is substantially the same as the horizontal dimension $D_2$ of the second portion 234B.

In some embodiments, sidewalls 236 of the protruding portion 234 define at least a portion of the cavities 242. In some embodiments, each cavity 242 is partially defined by the sidewalls 236 of the protruding portion 234, the lower surface 233 of the first substrate 230 and an upper surface 244 of the second substrate 240. In some embodiments, two of the lateral sides defining each cavity 242 comprise the sidewall of 236 of the protruding portion 234, and other lateral sides (e.g., two other lateral sides) defining the cavity 242 are open. In some such embodiments, and with reference to FIG. 2A, at least some of the lateral sides of the radiation shields 245 may be exposed and the cavities 242 may be referred to as "open cavities."

A vertical (e.g., in the Z-direction) height H of the protruding portion 234 may be defined by the sidewalls 236 and may be within a range of from about 0.30 millimeter (mm) to about 2.0 mm, such as from about 0.75 mm to about 1.0 mm, from about 1.0 mm to about 1.5 mm, or from about 1.5 mm to about 2.0 mm. In some embodiments, the height H is from about 0.75 mm to about 1.0 mm. However, the disclosure is not so limited, and the height H may be different than those described. The vertical height H of the protruding portion 234 may correspond to a distance between the lower surface 233 of the first substrate 230 in contact with the radiation shield 245 and the lower surface 233 of the protruding portion 234 in contact with a second interconnection layer 260 electrically coupling the first substrate 230 to the second substrate 240.

Each cavity 242 may be sized and shaped to receive one radiation shield 245. In some embodiments, the first substrate 230 defines four (4) cavities 242 and the radiation detection sub-assembly 210 is configured to include four (4) radiation shields 245. In other embodiments, and as described in further detail below, each cavity 242 may be sized and shaped to house more than one radiation shield 245.

In some embodiments, the radiation shields 245 are in contact with the lower surface 233 of the first substrate 230. The radiation shields 245 may be horizontally spaced from the sidewalls 236 of the protruding portion 234. In other embodiments, the radiation shields 245 directly contact the sidewalls 236 of the protruding portion 234. Although the radiation shields 245 have been described and illustrated as contacting surfaces of the first substrate 230, the disclosure is not so limited. In other embodiments, the radiation shields 245 contact one or more surfaces of the second substrate 240. In some embodiments, the radiation shields 245 contact surfaces of the first substrate 230 and surfaces of the second substrate 240.

The radiation shields 245 may be configured (e.g., shaped to, include a specific material or multiple materials) to inhibit a passage of radiation (e.g., x-ray radiation, gamma-ray radiation) therethrough and/or attenuate (e.g., absorb) radiation impingent thereon. The radiation shields 245 may be formed of and include one or more materials, the materials comprising one or more of tungsten, lead, tantalum, leaded glass, and heavy metal powder composites (e.g., tungsten powder in a polymer binder). In some embodiments, some or a totality of radiation shields 245 comprise tungsten, lead, tantalum, leaded glass, and heavy metal powder composites. In some embodiments, one or more of (e.g., all of) the radiation shields 245 comprise tungsten.

A thickness $T_1$ of the radiation shields 245 may be less than or equal to the height H of the protruding portion 234. In some embodiments, the thickness $T_1$ is less than the height H of the protruding portion 234. In some such embodiments, a vertically lower surface of the radiation shield 245 may be located vertically above the lower surface 233 of the first substrate 230 in contact with the second interconnection layer 260 (e.g., located closer to the first interconnection layer 250).

The thickness $T_1$ of the radiation shield 245 may be tailored at least partially based on the power of the radiation 112 (FIG. 1), the sensitivity of electronic components of the detector tile 200 to radiation, or both. For example, the thickness $T_1$ may be increased for relatively higher radiation 112 sources and for detector tiles 200 including more sensitive electronic components. The thickness $T_1$ may be within a range of from about 0.75 mm to about 2.0 mm, such as from about 0.75 mm to about 1.0 mm, from about 1.0 mm to about 1.5 mm, or from about 1.5 mm to about 2.0 mm. In some embodiments, the thickness $T_1$ is about 1.0 mm. However, the disclosure is not so limited and the thickness $T_1$ may be different than those described. In some embodiments, the radiation shields 245 may be stacked in the vertical direction (e.g., the Z-direction). For example, in some embodiments, a first radiation shield 245 may be in contact with the lower surface 233 of the first substrate 230 and a second radiation shield 245 may be vertically below (e.g., the Z-direction) and within the same lateral boundaries (e.g., in the X-direction, in the Y-direction) as the first radiation shield 245 and may be located on the upper surface 244 of the second substrate 240. In some such embodiments, the first shield and the second shield may exhibit the same thickness.

A gap G may separate a lowermost surface of the radiation shield 245 from the upper surface 244 of the second substrate 240. Stated another way, in some embodiments, the radiation shield 245 is vertically spaced from the second substrate 240 by the gap G. The size of the gap G may be based on the sum of the difference between the height H and the thickness $T_1$ and the vertical height of the second interconnection layer 260.

The first substrate 230 may be formed of and include one or more of an organic polymer (e.g., a plastic material), a ceramic material (e.g., aluminum oxide), fiberglass, silicon, silicon dioxide, sapphire, germanium, gallium arsenide, a printed circuit board material (e.g., laminates, resin impregnated B-stage cloth), glass reinforced epoxy laminates, FR4 grade materials (e.g., glass epoxy), or other suitable materials.

The second interconnection layer 260 electrically coupling the first substrate 230 to the second substrate 240 may comprise bond pads 263 on the bottom surface 233 of the first substrate 230, first conductive structures 262 coupled to the bond pads 263, and bond pads 264 coupled to the upper surface 244 of the second substrate 240. The bond pads 263 may facilitate electrical connection between the first substrate 230 first conductive structures 262 and the bond pads 264 may facilitate electrical connection between the first conductive structures 262 and the second substrate 240. The bond pads 263 of the first substrate 230 may be located on the bottom surface 233 of the first substrate 230 on the protruding portion 234. The first conductive structures 262 may be formed of and include one or more of the materials described above with reference to the first conductive pads 208. The bond pads 263 and the bond pads 264 may be substantially similar to the bond pads 208 and may be formed of and include one or more of the materials described above with reference to the conductive pads 208.

With collective reference to FIG. 2A through FIG. 2C, the first conductive structures 262 may be located on protruding portion 234 of the first substrate 230. In some embodiments, the second portion 234B includes a greater number of the first conductive structures 262 than the first portion 234A.

Although the second interconnection layer 260 has been described and illustrated as including the first conductive structures 262, the bond pads 263, and the bond pads 264, the disclosure is not so limited. In other embodiments, the second interconnection layer 260 comprises one or more of solder balls, conductive epoxy, electrically conductive spring contacts, or other structures configured to form physical and electrical contact between the radiation first substrate 230 and the second substrate 240. In addition, although FIG. 2A through FIG. 2C have been illustrated as including a particular number of bond pads 263, first conductive structures 262, and bond pads 264 of the second interconnection layer 260, the disclosure is not so limited. The number of bond pads 263, first conductive structures 262, and bond pads 264 may correspond to a number of photodiodes of the photodetector array 206. In some embodiments, the number of bond pads 263, first conductive structures 262, and bond pads 264 may be greater than about 1,000 (e.g., 1,024).

With continued reference to FIG. 2A, first routing structures 238 may be formed within the first substrate 230 and configured to electrically connect the first interconnection layer 220 to the second interconnection layer 260. The first routing structures 238 electrically connect, for example, the bond pads 209 of the first interconnection layer 220 to the bond pads 263 of the second interconnection layer 260. In some embodiments, each first routing structure 238 may individually couple one of the bond pads 209 to one of the bond pads 263. The first routing structures 238 may convey, for example, low level analog signals from the radiation detection sub-assembly 210 through the first substrate 230 and to the second substrate 240 for conveying the signals to the electronics sub-assembly 280. The first routing structures 238 may facilitate routing of the electrical signals through the first substrate 230 and around the radiation shields 245. In some embodiments, the first routing structures 238 are external to and laterally offset from the radiation shields 245 and route around the radiation shields 245. In some embodiments, the first routing structures 238 extend into the protruding portion 234 of the first substrate 230. For clarity and ease of understanding the description, FIG. 2A illustrates only one first routing structure 238 through the first substrate 230. It will be understood that several first routing structures 238 (e.g., corresponding to a number of the first conductive pads 208) extend through the first substrate 230.

The first routing structures 238 may be formed of and include conductive material, such as one or more of tungsten, molybdenum, nickel, gold, copper, tin, and silver. In some embodiments, such as where the first substrate 230 comprises a ceramic material, the first routing structures 238 comprise one tungsten and/or molybdenum and may be plated with nickel and/or gold (e.g., the first routing structures 238 may be plated at locations proximate the bond pads 209 and the bond pads 263). In other embodiments, such as where the first substrate 230 comprises a printed circuit board, the first routing structures 238 may be formed of and include copper. In some such embodiments, the first routing structures 238 may be plated with one or more of nickel, gold, tin, and silver at locations proximate the bond pads 209 and the bond pads 263.

The second substrate 240 may include second routing structures 246 to electrically couple the second interconnection layer 260 to a third interconnection layer 270 comprising second conductive structures 272 between bond pads 273 and bond pads 275. The second routing structures 246 may comprise a conductive material, such as one or more of the materials described above with reference to the first routing structures 238. In some embodiments, the second routing structures 246 comprise the same material composition as the first routing structures 238. In some embodiments, each of the second routing structures 246 may individually electrically connect a bond pad 264 of the second interconnection layer 260 to a bond pad 273 of the third interconnection layer 270. In some embodiments, a number of the second routing structures 246 may correspond to a number of the bond pads 263 and a number of the bond pads 273. For clarity and ease of understanding the description, FIG. 2A illustrates only one second routing structure 246. It will be understood that several second routing structures 246 (e.g., corresponding to a number of the bond pads 263) extend through the second substrate 240.

The second substrate 240 may be formed of and include one or more of the materials described above with reference to the first substrate 230. In some embodiments, the second substrate 240 comprises substantially the same material composition as the first substrate 230. In other embodiments, the second substrate 240 comprises a different material composition than the first substrate 230. In some embodiments, one of the first substrate 230 or the second substrate 240 comprises a ceramic material and the other of the first substrate 230 or the second substrate 240 comprises an FR4 material (e.g., glass epoxy). In some embodiments, the first substrate 230 comprises a ceramic material and the second substrate 240 comprises another material, such as an FR4 material.

The third interconnection layer 270 electrically couples the second substrate 240 to the electronics sub-assembly 280. The electronics sub-assembly 280 is configured to process analog signals generated by the radiation detection sub-assembly 210 to generate digital signals. By way of non-limiting example, the electronics sub-assembly 280 may comprise analog-to-digital (A/D) converters, digital-to-analog converters, photon counters, or other electronic components. In some embodiments, the electronics sub-assembly 280 comprises one or more application specific integrated circuit (ASIC) packages 282. The ASIC packages 282 may be configured to, among other things, filter the analog signals (e.g., to reduce noise, smooth the signal, enhance aspects of the signal), cover the analog signals to digital signals, and filter the digital signals. In some embodiments, each ASIC package 282 comprises an A/D converter chip. In other embodiments, the electronics sub-assembly comprises a bare die, and/or a bare die on substrate (e.g., a carrier substrate).

In some embodiments, a number of the ASIC packages 282 may be equal to the number of the radiation shields 245. In some embodiments, the detector tile 200 includes four ASIC packages 282.

Each ASIC package 282 may individually include, for example, one or more semiconductor dice 286. Each semiconductor die 286 may comprise, for example, a silicon wafer or silicon substrate including one or more control logic devices for effectuating operation of the detector tile 200. By way of non-limiting example, the semiconductor dice 286 may be configured to filter the analog signals (e.g., to reduce noise, smooth the signal, enhance aspects of the signal) from the radiation detection sub-assembly 210, cover the analog signals to digital signals, and filter the digital signals.

In some embodiments, each ASIC package 282 comprises two (2) of the semiconductor dice 286. However, the disclosure is not so limited and in other embodiments, the ASIC packages 282 individually include fewer (e.g., one (1)) semiconductor die 286, or more semiconductor dice 286, such as more than two (2) semiconductor dice 286, more than three (3) semiconductor dice 286, or more than four (4) semiconductor dice 286.

The semiconductor dice 286 may be separated from one another by, for example, a dielectric material 288. The dielectric material 288 may include, for example, silicon dioxide, phosphosilicate glass (PSG), borophosphosilicate glass (BPSG), or another material.

The semiconductor dice 286 may be surrounded (e.g., encapsulated) by a package material 289. The package material 289 may comprise, for example, a plastic material, such as a thermoplastic material, a metal material (e.g., a nickel-cobalt ferrous alloy, such as KOVAR® of CRS Holdings, Inc. of Delaware), or a ceramic material.

The ASIC packages 282 may be electrically connected to a connector 290 by means of third routing structures 284 extending through the second substrate 240. The third routing structures 284 electrically connect the bond pads 273 to bond pads 291 connected to third conductive structures 292 connected to the connector 290. Third routing structures 293 may be electrically coupled to the third conductive structures 292 and configured to route one or more signals to and/or from the connector 290. The connector 290 may be operably coupled to, for example, connection cables of a detector module of the radiation detector 116 of the scanning system 100 of FIG. 1. Power may be provided to detector tile 200 through the connector 290. The third routing structures 284 may be formed of and include conductive material, such as one or more of the materials described above with reference to the first routing structures 238. In some embodiments, the third routing structures 284 comprise substantially the same material composition as the first routing structures 238. The bond pads 291 may be formed of and include one or more conductive materials, such as one or more of the materials described above with reference to the bond pads 208. The third routing structures 293 may be formed of and include conductive material, such as one or more of brass, bronze, copper, and steel. In some embodiments, the third routing structures 293 are plated with another metal, such as one or more of tin, silver, gold, and nickel.

With continued reference to FIG. 2B, in some embodiments, the semiconductor dice 286 are located vertically (e.g., in the Z-direction) below the radiation shields 245 and are located within lateral boundaries defined by the radiation shields 245. In other words, the semiconductor dice 286 may not laterally extend beyond lateral boundaries of the radiation shields 245 directly vertically overlying the semiconductor dice 286. Placing the semiconductor dice 286 within lateral boundaries defined by the radiation shields 245 may physically protect (e.g., block) radiation that would otherwise be impingent upon the semiconductor dice 286 and may, therefore, protect the semiconductor dice 286 from undesired damage from the radiation.

Although the radiation shields 245 have been described and illustrated as having a larger lateral cross-sectional area (e.g., in the XY plane) than the semiconductor dice 286, the disclosure is not so limited. In other embodiments, the radiation shields 245 have substantially the same cross-sectional area (e.g., lateral footprint) as the semiconductor dice 286. In some such embodiments, one or more (e.g., all of) lateral edges of the semiconductor dice 286 may be laterally aligned with one or more (e.g., all of) lateral edges of the radiation shields 245.

Although the semiconductor dice 286 have been described and illustrated as being located within the ASIC packages 282, the disclosure is not so limited. In other embodiments, the electronics sub-assembly 280 does not include the ASIC packages 282 and the semiconductor dice 286 are directly flip chip bonded to a lower surface 248 of the second substrate 240.

Figure 2E:
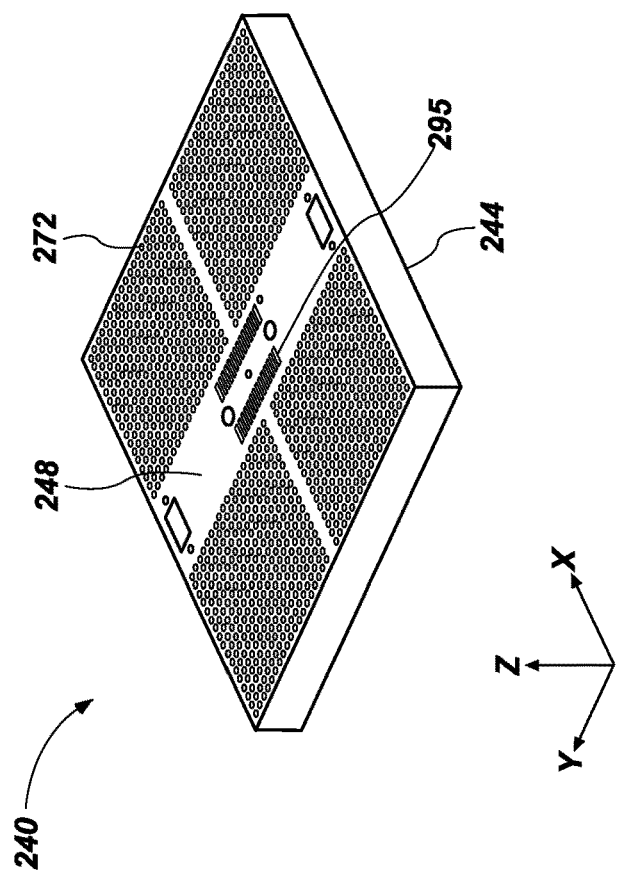
FIG. 2E is a simplified perspective view of view of a second substrate of the detector tile of FIG. 2A.
Figure 2D:
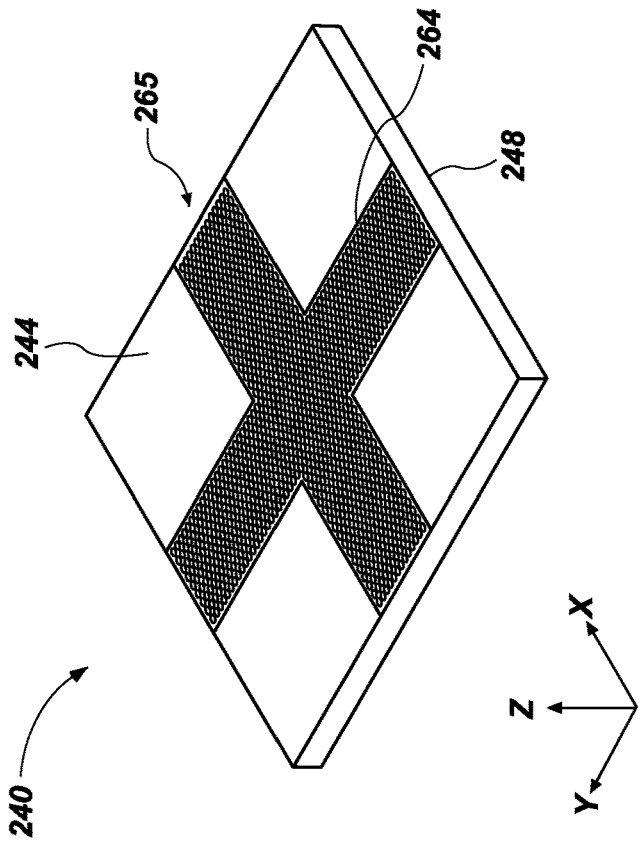
FIG. 2D is another simplified perspective view of the first substrate of the detector tile.

FIG. 2D is a simplified partial schematic perspective view of the upper surface 244 of the second substrate 240. FIG. 2E is a simplified partial perspective view of the lower surface 248 of the second substrate 240. With collective reference to FIG. 2A and FIG. 2D, the upper surface 244 of the second substrate 240 comprises a pattern 265 of the bond pads 264 corresponding to the pattern of the first conductive structures 262 on the protruding portion 234 of the first substrate 230. Regions of the upper surface 244 corresponding to locations of the cavities 242 (FIG. 2A, FIG. 2B) and the radiation shields 245 may not include the bond pads 263.

With reference to FIG. 2E, the lower surface 248 of the second substrate 240 may include the second conductive structures 272 of the third interconnection layer 270. In some embodiments, the lower surface 248 includes bond pads 295 for electrically connecting the second substrate 240 to the connector 290 (FIG. 2A), such as by soldering pins of the connector 290 thereto.

FIG. 2F is a simplified exploded view of the detector tile 200 illustrating the components thereof in a disassembled state. The detector tile 200 includes the scintillator array 205 including, for example, a first scintillator array 205a and a second scintillator array 205b neighboring the first scintillator array 205a; the photodetector array 206 underlying the scintillator array 205 and including, for example, a first photodiode array 206a and a second photodiode array 206b; the routing sub-assembly 220 underlying the photodetector array 206, the routing sub-assembly 220 including the first substrate 230 vertically underlying the photodetector array 206, the radiation shields 245 vertically underlying the first substrate 230 and between the first substrate 230 and the second substrate 240; and the ASIC packages 282 coupled to an underside of the second substrate 240.

Figure 3A:
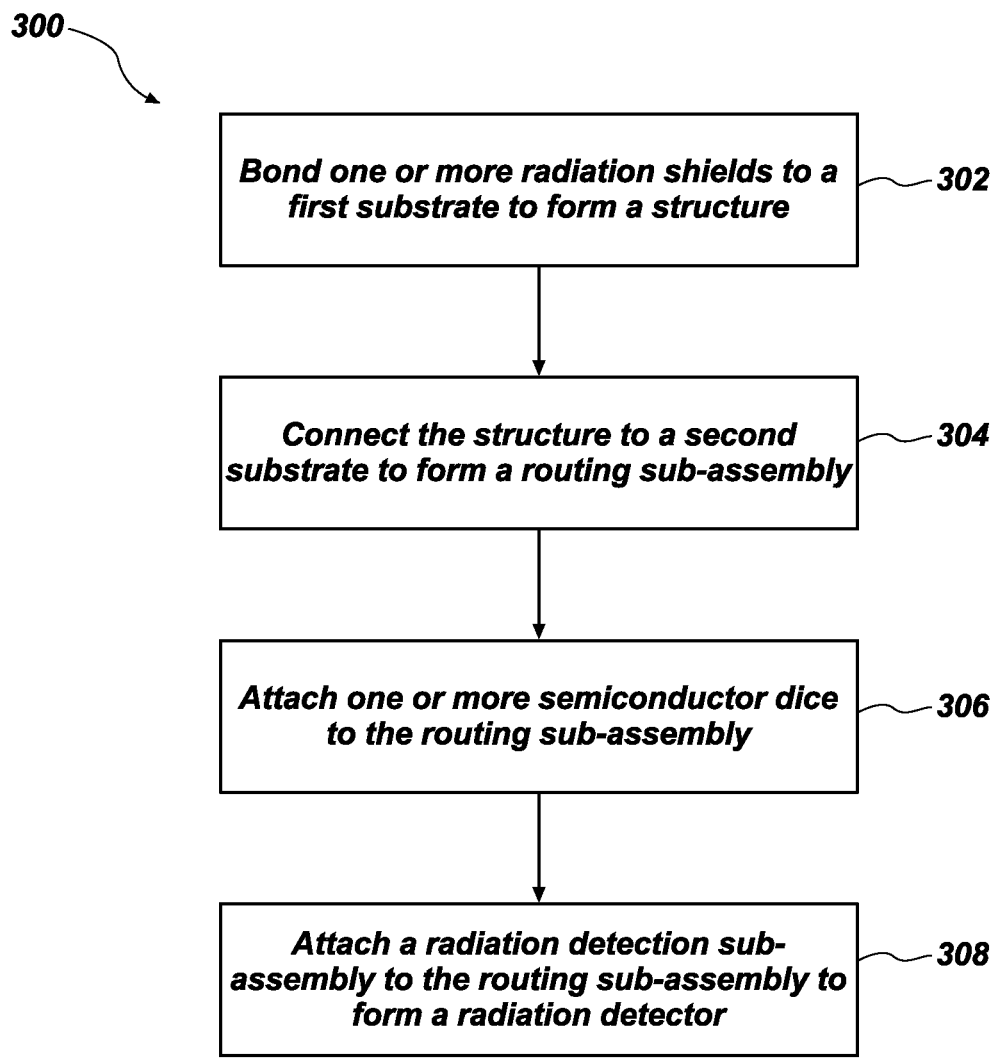
FIG. 3A is a simplified flow diagram illustrating a method of forming the detector tile of FIG. 2A, in accordance with embodiments of the disclosure.

FIG. 3A through FIG. 3E illustrate a method of forming the detector tile 200, in accordance with embodiments of the disclosure. FIG. 3A is a simplified flow chart illustrating a method of forming the radiation detector. FIG. 3B through FIG. 3E are simplified perspective views illustrating different acts of forming the radiation detector.

With reference to FIG. 3A, the method 300 includes act 302 including bonding one or more radiation shields to a first substrate to form a structure; act 304 including connecting the structure to a second substrate to form a routing sub-assembly; act 306 including attaching one or more semiconductor dice to the routing sub-assembly; and act 308 including attaching a radiation detection sub-assembly to the routing sub-assembly to form a radiation detector.

Figure 3C:
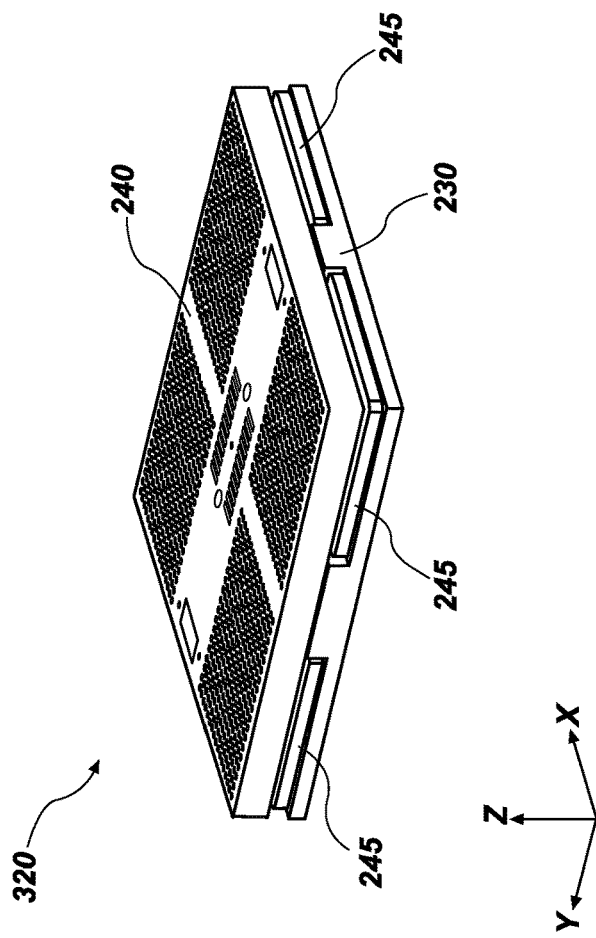
Figure 3B:
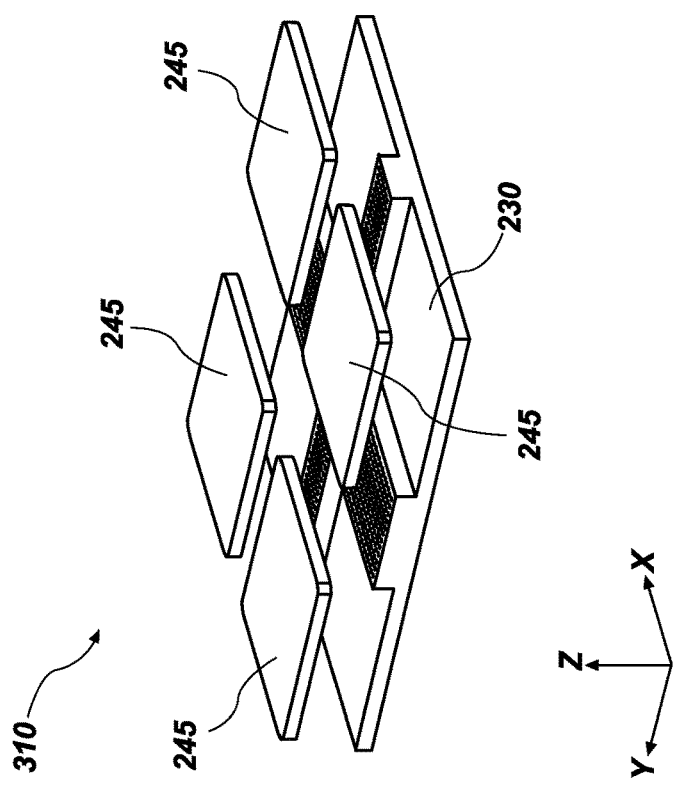

Act 302 includes bonding one or more radiation shields to a first substrate to form a structure. For example, with reference to FIG. 3B, one or more radiation shields 245 may be attached to the first substrate 230 (e.g., to lower surfaces 233 (FIG. 2A) of the first substrate 230) to form a structure 310. In FIG. 3B, the radiation shields 245 are illustrated above the first substrate 230, but it will be understood that the radiation shields 245 are physically brought into contact with the lower surface 233 of the first substrate 230 and bonded to the first substrate 230.

In some embodiments, the radiation shields 245 are bonded to the first substrate 230 with an electrically conductive adhesive (ECA). By way of non-limiting example, the radiation shields 245 may be attached to the first substrate with one or more electrically conductive epoxies. In some embodiments, the radiation shields 245 are individually connected to an electrical ground of the first substrate 230. Electrically connecting the radiation shields 245 to ground may reduce cross talk and noise during operation of the detector tile 200 (FIG. 2A).

With reference again to FIG. 3A, act 304 includes connecting the structure 310 (FIG. 3B) to a second substrate to form a routing sub-assembly. Referring to FIG. 3C, the structure 310 (FIG. 3B) is connected to the second substrate 240 to form a routing sub-assembly 320. In some embodiments, the second substrate 240 is attached to the structure 310 by attaching the first conductive structures 262 (FIG. 2A) to the bond pads 264 (FIG. 2A) with a solder paste and performing a reflow soldering process to form the second interconnection layer 260 (FIG. 2A) and electrically connect the second substrate 240 to the first substrate 230.

Referring back to FIG. 3A, act 306 includes attaching one or more semiconductor dice to the routing sub-assembly. With reference to FIG. 3D, one or more ASIC packages 282 (each including one or more semiconductor dice) may be attached to the lower surface 248 of the second substrate 240 of the routing sub-assembly 320 to form a structure 330. By way of non-limiting example, bond pads 273 of the second substrate 240 may be connected to the second conductive structures 272 with a solder paste to form the third interconnection layer 270 (FIG. 2A) and electrically connect the ASIC packages 282 to the second substrate 240.

Act 308 includes attaching a radiation detection sub-assembly to the routing sub-assembly to form a radiation detector. With reference to FIG. 3E, a radiation detection sub-assembly 340 including the photodetector array 206 and the scintillator array 205 is attached to the routing sub-assembly 330 to form a radiation detector 350. In some embodiments, the radiation detection sub-assembly 340 is attached to the upper surface 232 of the first substrate 230. By way of non-limiting example, an electrically conductive adhesive 254 (FIG. 2A) may be used to electrically connect the bond pads 209 of the first substrate 230 to the bond pads 208 of the photodetector array 206.

Although the detector tile 200 of FIG. 2A through FIG. 2F has been described and illustrated as including the radiation shields 245 individually within an open cavity 242 (FIG. 2A) wherein at least some lateral sides of the radiation shields 245 are exposed (e.g., not neighboring the protruding portion 234 of the first substrate 230), the disclosure is not so limited. In other embodiments, the first substrate 230 defines enclosed cavities.

Figure 4B:
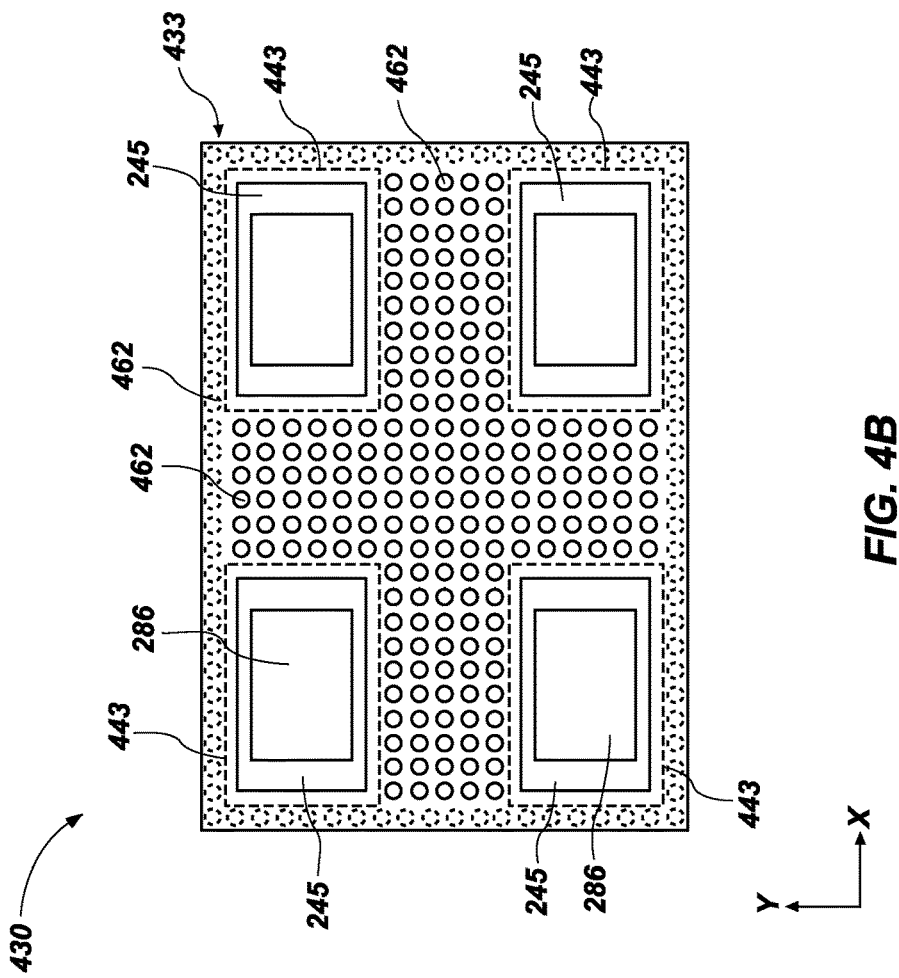
FIG. 4A and FIG. 4B are a respective simplified perspective view and a simplified planar view of another detector tile, in accordance with additional embodiments of the disclosure.
Figure 4A:
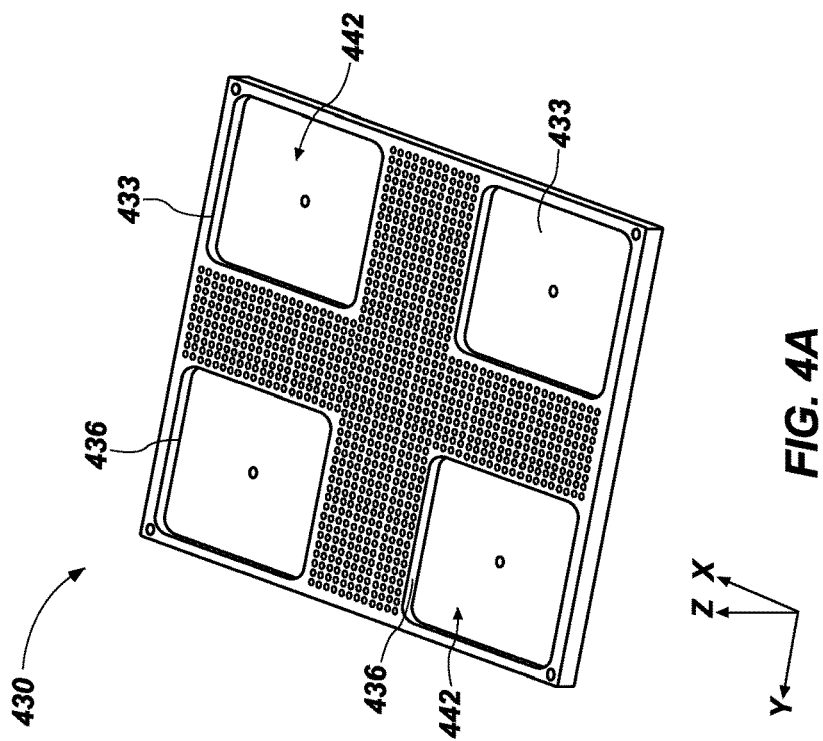

FIG. 4A is a simplified perspective view of a first substrate 430, in accordance with embodiments of the disclosure. FIG. 4B is a simplified top-down view of the first substrate 430. The view of the first substrate 430 in FIG. 4B is similar to the view of the first substrate 230 of FIG. 2C.

The first substrate 430 may replace the first substrate 230 (FIG. 2A) of the detector tile 200. With combined reference to FIG. 4A and FIG. 4B, the first substrate 430 may include a bottom surface 433 (corresponding to the lower surface 233 (FIG. 2A) of the first substrate 230 (FIG. 2A)).

With reference to FIG. 4A, the bottom surface 433 may define cavities 442. The cavities may be defined by sidewalls 436. The sidewalls 436 may substantially surround all sides of each cavity 442. With reference to FIG. 4B, surfaces of the cavities 442 are illustrated in broken lines 443. Each cavity 442 may be configured to house one radiation shield 245. One or more semiconductor dice 286 (FIG. 2A) may be located within lateral boundaries and vertically under each radiation shield 245, as described above with reference to FIG. 2A through FIG. 2F.

Conductive structures 462 (corresponding to the first conductive structures 262 (FIG. 2A)) may be located on the bottom surface 433 of the first substrate 430. In some embodiments, the conductive structures 462 may be substantially the same as the first conductive structures 262. In some embodiments, the conductive structures 462 are located on the bottom surface 433 proximate only some lateral sides of each cavity 442. For example, only the bottom surface 433 proximate inner lateral sides (e.g., lateral sides of the each cavity 442 proximate a lateral center of the second substrate 430) of each cavity 442 are neighbored by the conductive structures 462 in some embodiments. In some such embodiments, the bottom surface 433 of outer lateral sides of each cavity 442 (e.g., lateral sides of the second substrate 430 located around a periphery of the second substrate 430) do not include conductive structures 462.

In other embodiments, the outer lateral sides of each cavity 442 includes the conductive structures 462, as illustrated by conductive structures 462 shown in broken lines around a periphery of the second substrate 430.

Figure 5A:
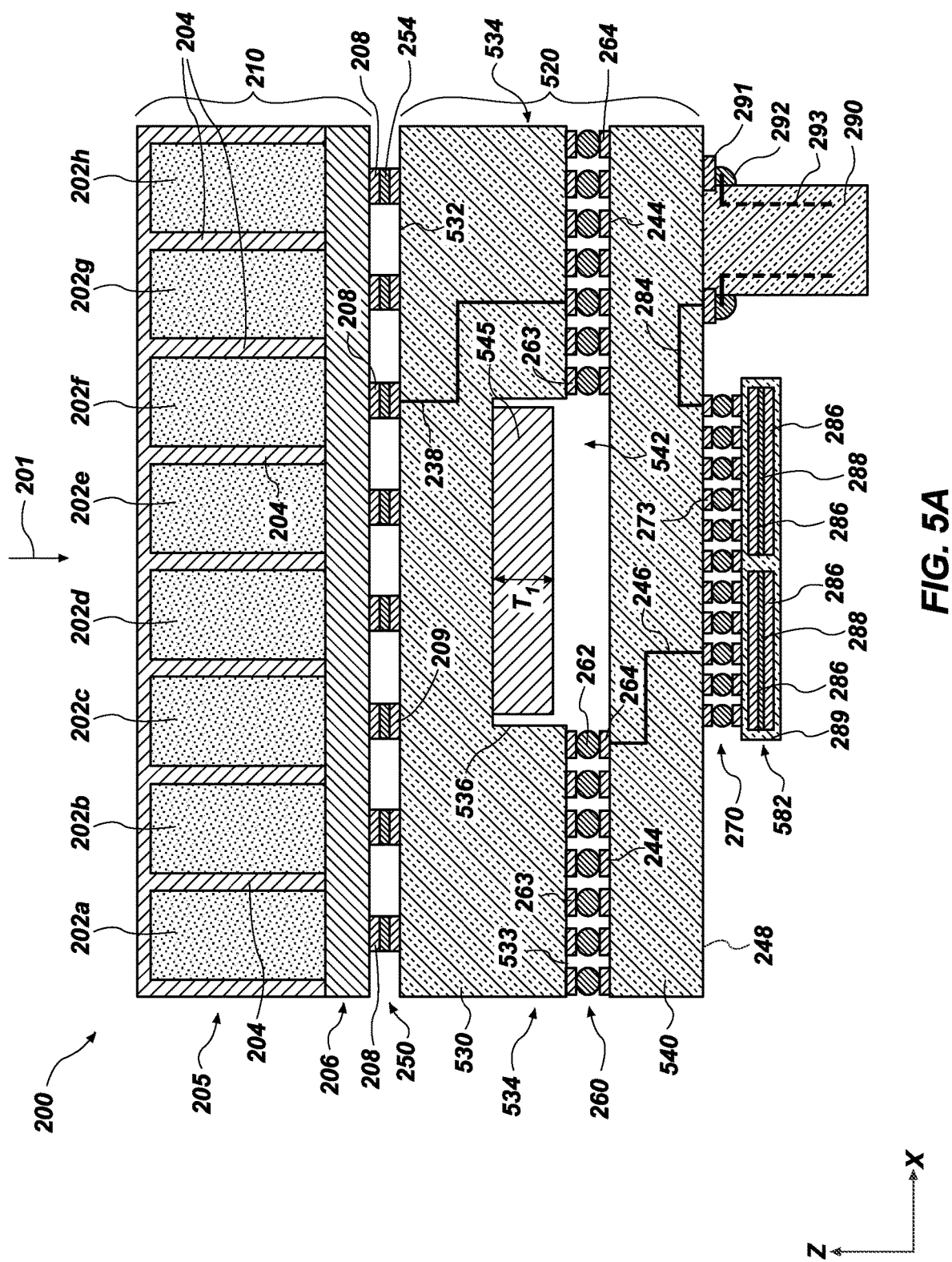
FIG. 5A and FIG. 5B are a respective simplified cross-sectional view and a planar view of a detector tile, in accordance with other embodiments of the disclosure.
Figure 5B:
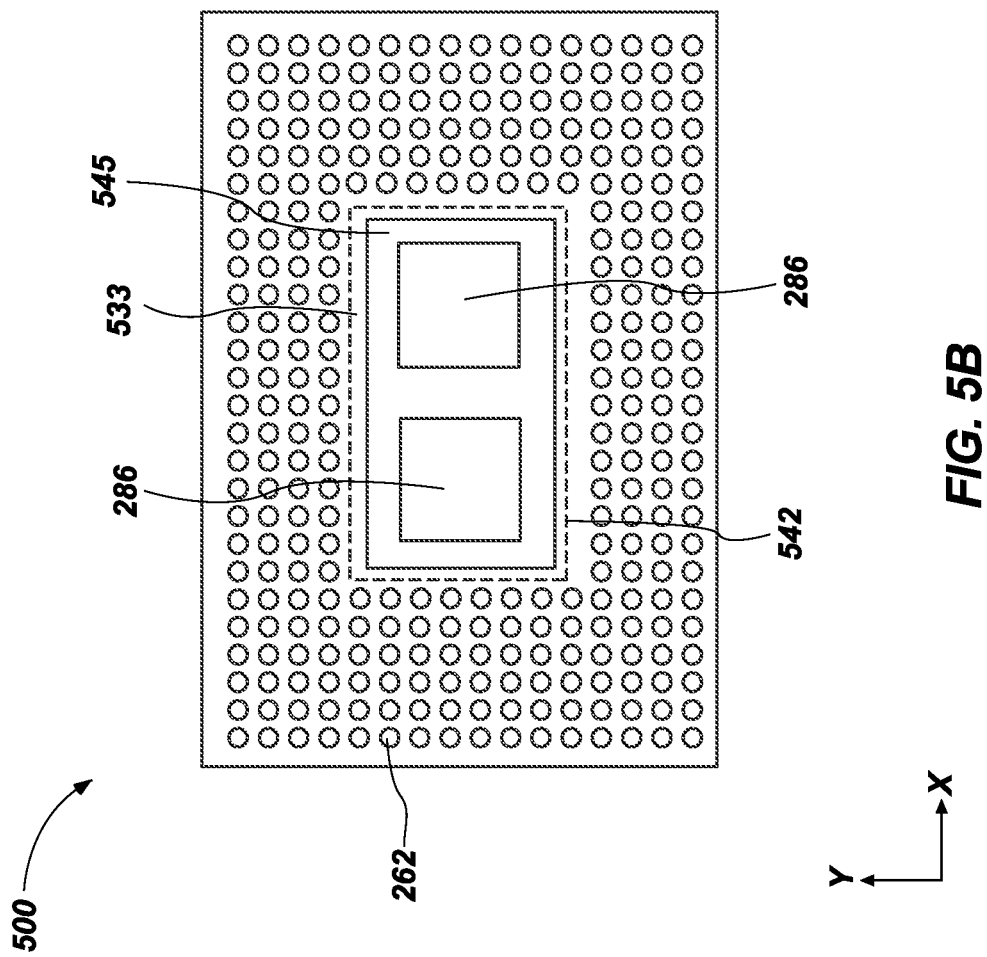

FIG. 5A is a simplified partial cross-sectional view in the XZ plane of a detector tile 500, in accordance with embodiments of the disclosure. The detector tile 500 may be substantially similar to the detector tile 200 described above with reference to FIG. 2A through FIG. 2F, except the detector tile 500 may include a single cavity 542 and a different number of radiation shields 545 and ASIC packages 582 than the detector tile 200. Components and structures of the detector tile 500 that are the same or substantially the same as corresponding components and structures of the detector tile 200 retain the same numerical designation. FIG. 5B is a simplified top-down view of the detector tile 500 illustrating the same view of the detector tile 200 as that illustrated in FIG. 2C.

With reference to FIG. 5A and FIG. 5B, the detector tile 500 includes a routing sub-assembly 520 including a first substrate 530 attached to and in electrical communication with a second substrate 540. The first substrate 530 may be substantially the same as the first substrate 230 (FIG. 2B), except that the first substrate 530 includes protruding portions 534 around a periphery thereof to define a single cavity 542. The second substrate 540 may be substantially similar to the second substrate 240 (FIG. 2B), except the location of the bond pads 264 and the first conductive structures 262 may be different to correspond to the location of the bond pads 263 (corresponding to the location of radiation shields 545). A radiation shield 545 may be disposed within the cavity 542 and configured to vertically overlie the ASIC package 582. The radiation shield 545 may be formed of and include substantially the same materials described above with reference to the radiation shield 245 described above with reference to FIG. 2A through FIG. 2F. In some embodiments, the radiation shield 545 comprises tungsten. The cavity 542 is illustrated in broken lines in FIG. 5B.

With reference to FIG. 5A, an upper surface 532 of the first substrate 530 is in contact with the photodetector array 206 by means of the first interconnection layer 250, which is substantially the same as the first interconnection layer 250 described above with reference to FIG. 2A. A lower surface 533 of the first substrate 530 may include bond pads 263 in electrical communication with the first conductive structures 262, which are in turn, in electrical communication with the bond pads 264 to form the second interconnection layer 260. Since the protruding portions 534 are located proximate a periphery of the first substrate 530, the first conductive structures 262, the bond pads 263, and the bond pads 264 of the second interconnection layer 260 are located around the periphery of the first substrate 530 (e.g., vertically underlying the protruding portions 534).

With continued reference to FIG. 5A, the lower surface 248 of the second substrate 240 may be in electrical communication with the ASIC package 582 by means of the third interconnection layer 270. The third interconnection layer 270 may be located vertically below and within lateral boundaries of the radiation shields 545. In some embodiments, the third interconnection layer 270 is located at a laterally central portion of the detector tile 500.

The ASIC package 582 may vertically underlie and be located within lateral boundaries of the radiation shield 545. The ASIC package 582 may be substantially similar to the ASIC packages 582 described above with reference to FIG. 2B, except that the ASIC package 582 may include more than one semiconductor die 286. For example, the ASIC package 582 may include four (4) semiconductor dice 286.

Figure 6A:
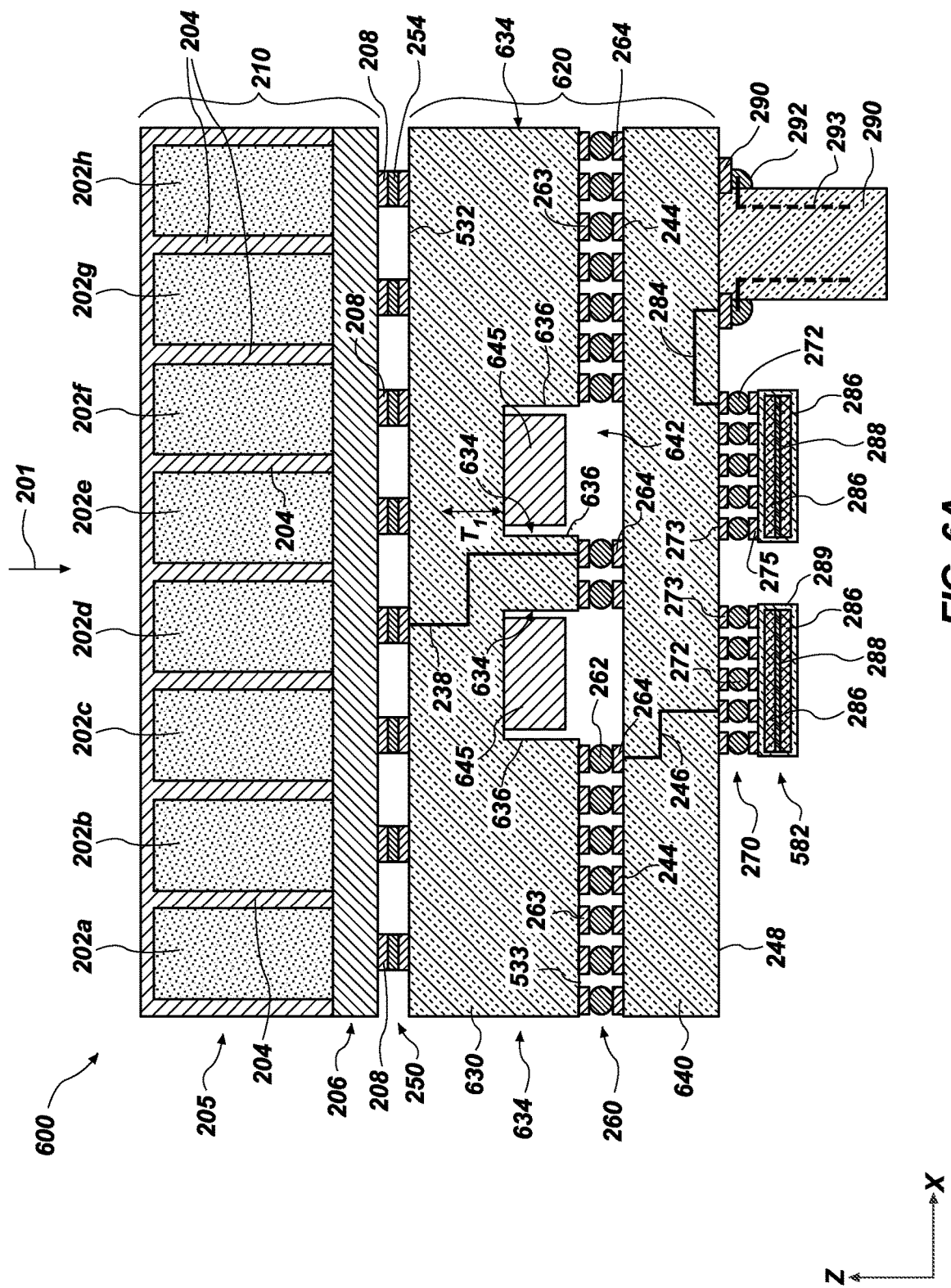
FIG. 6A and FIG. 6B are a respective simplified cross-sectional view and a planar view of an additional detector tile, in accordance with additional embodiments of the disclosure.
Figure 6B:
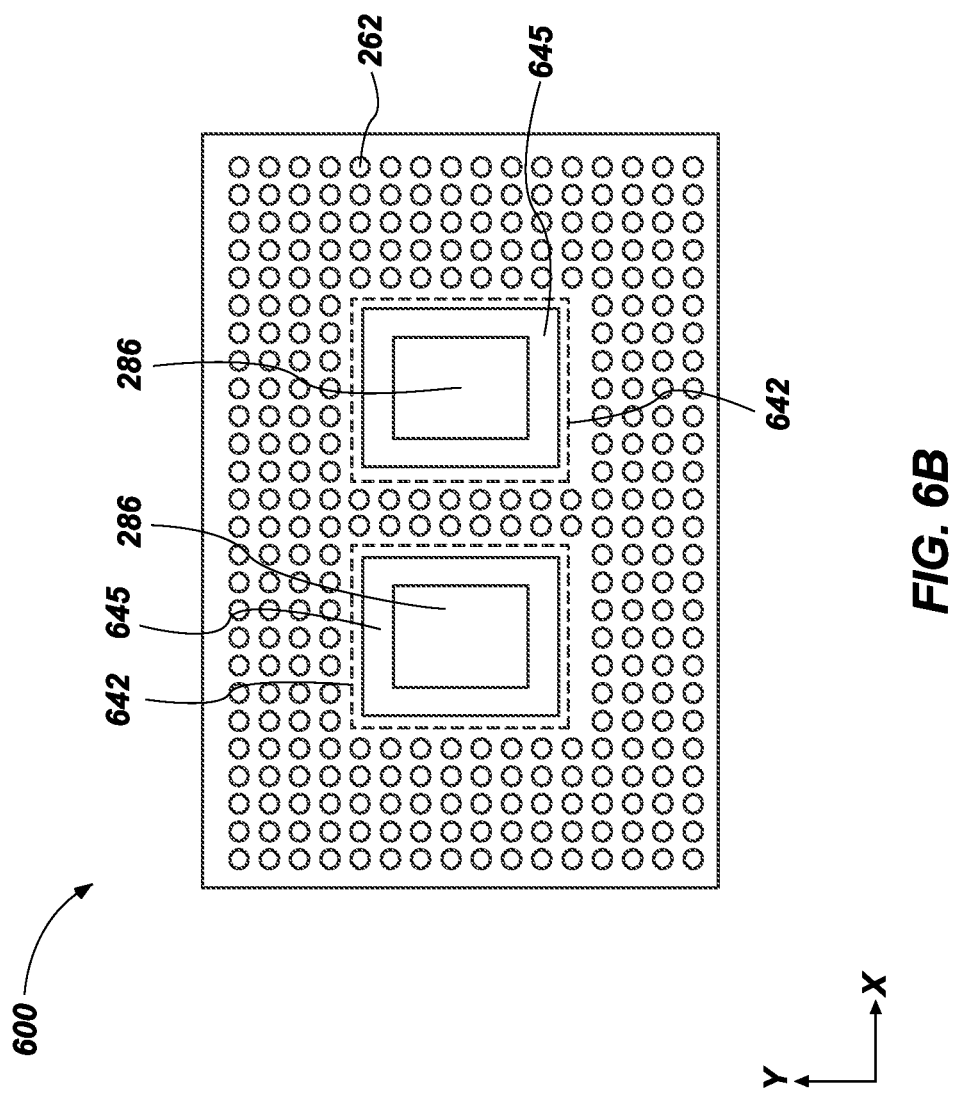

FIG. 6A is a simplified partial cross-sectional view of a detector tile 600, in accordance with embodiments of the disclosure. The detector tile 600 may be substantially the same as the detector tile 500 of FIG. 5A and FIG. 5B, except that the detector tile 600 includes a routing sub-assembly 620 including a first substrate 630 including more than one cavity 642 (illustrated in broken lines in FIG. 6B) defined by sidewalls 636 of protruding portions 634, the cavities 642 located within a laterally central portion of the detector tile 600. The first substrate 630 is in electrical communication with a second substrate 640 by means of the second interconnection layer 260. A radiation shield 645 may be disposed within each cavity 642. The radiation shield 645 may be formed of and include substantially the same materials described above with reference to the radiation shield 245. FIG. 6B is a simplified planar view of the detector tile 600 illustrating the same view as that illustrated in FIG. 2C.

With collective reference to FIG. 6A and FIG. 6B, the second interconnection layer 260 includes the first conductive structures 262, the bond pads 263, and the bond pads 264 laterally between the radiation shields 645 below a protruding portion 634 of the first substrate 630. Stated another way, the second interconnection layer 260 may include first conductive structures 262, the bond pads 263, and the bond pads 264 outside lateral boundaries of the radiation shields 645 and laterally between (e.g., in the X-direction) a first radiation shield 645 and a second radiation shield 645. In some embodiments, the first conductive structures 262, the bond pads 263, and the bond pads 264 may be located around a periphery of the first substrate 630 and the second substrate 640 and in a laterally central portion of the first substrate 630 and the second substrate 640 laterally between the cavities 642. The second substrate 640 may be substantially similar to the second substrate 540, except the pattern of the bond pads 264 and the first conductive structures 262 may correspond to the pattern of the bond pads 263 of the first substrate 630.

Although the radiation detector tiles 200 (FIG. 2A, FIG. 2C), 500 (FIG. 5A, FIG. 5B), 600 (FIG. 6A, FIG. 6B) have been described and illustrated as comprising the respective first substrate 230 (FIG. 2A, FIG. 2C), 530 (FIG. 5A, FIG. 5B), 630 (FIG. 6A, FIG. 6B) including sidewalls 236 (FIG. 2A, FIG. 2C), 536 (FIG. 5A, FIG. 5B), 636 (FIG. 6A, FIG. 6B) defining the respective protruding portions 234 (FIG. 2A, FIG. 2C), 534 (FIG. 5A, FIG. 5B), 634 (FIG. 6A, FIG. 6B), the disclosure is not so limited. In other embodiments, the second substrate may include protruding portions. In some such embodiments, the first substrate 230, 530, 630 may include protruding portions 234, 534, 634 or may not include the protruding portions 234, 534, 634.

Figure 7:
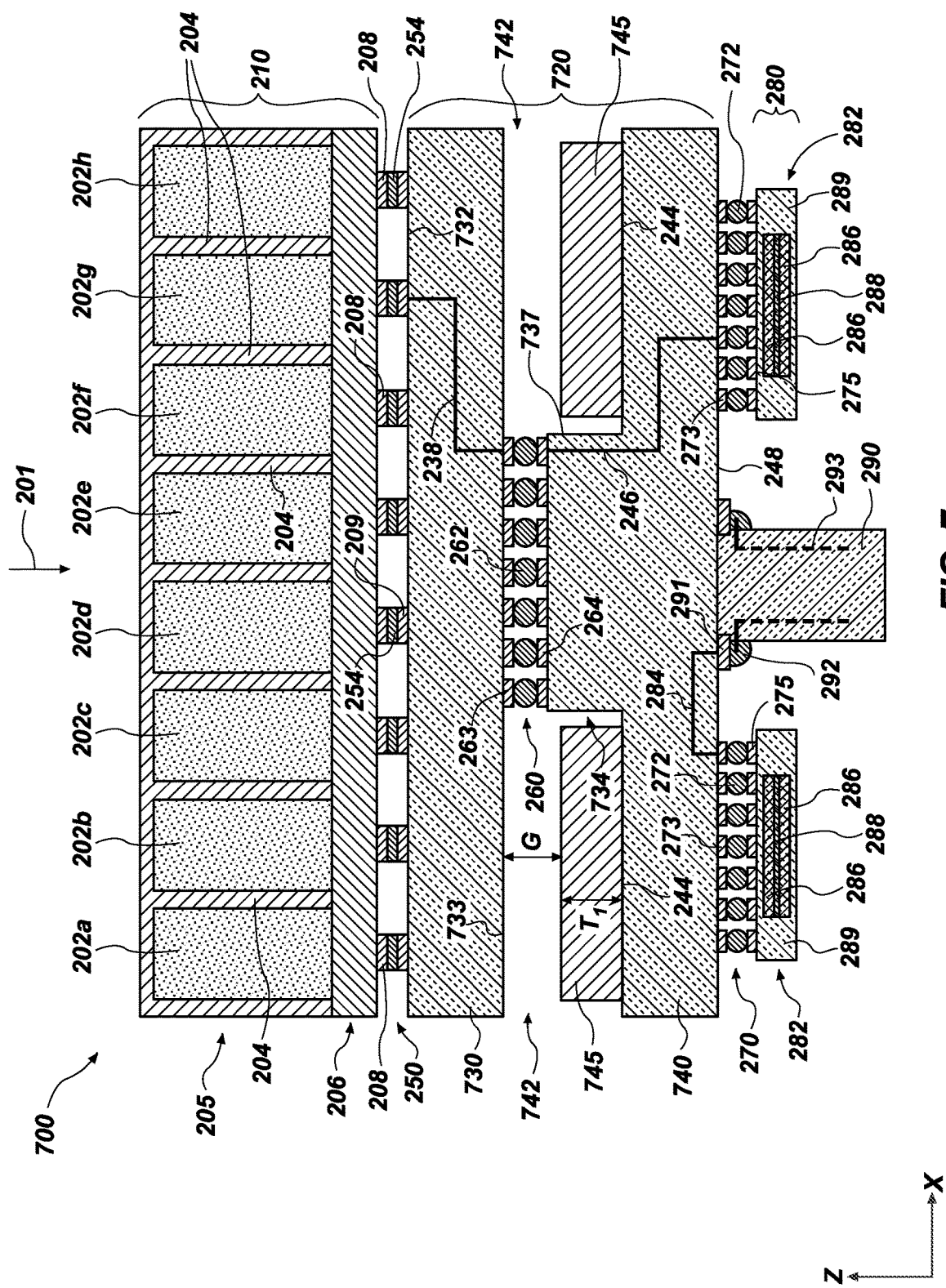
FIG. 7 is a simplified partial cross-sectional view of a detector tile, in accordance with embodiments of the disclosure.

FIG. 7 is a simplified partial cross-sectional view of a detector tile 700, in accordance with embodiments of the disclosure. The detector tile 700 is substantially similar to the detector tile 200 described above with reference to FIG. 2A through FIG. 2F, except the detector tile 700 includes a routing sub-assembly 720 including a first substrate 730 electrically connected to a second substrate 740, the second substrate 740 including a protruding portion 734.

The first substrate 730 may include an upper surface 732 and a lower surface 733, each of the upper surface 732 and the lower surface 733 being substantially planar and extending substantially parallel with each other. The first substrate 730 is coupled to the second substrate 740 by the second interconnection layer 260.

The second substrate 740 includes the protruding portion 734. The protruding portion 734 includes sidewalls 737 defining cavities 742 between the first substrate 730 and the second substrate 740. Radiation shields 745 may be disposed between the first substrate 730 and the second substrate 740 within the cavities 742, as described above with reference to the radiation shields 245 (FIG. 2B). The radiation shields 745 may be substantially the same as the radiation shields 245 (FIG. 2A).

Figure 8:
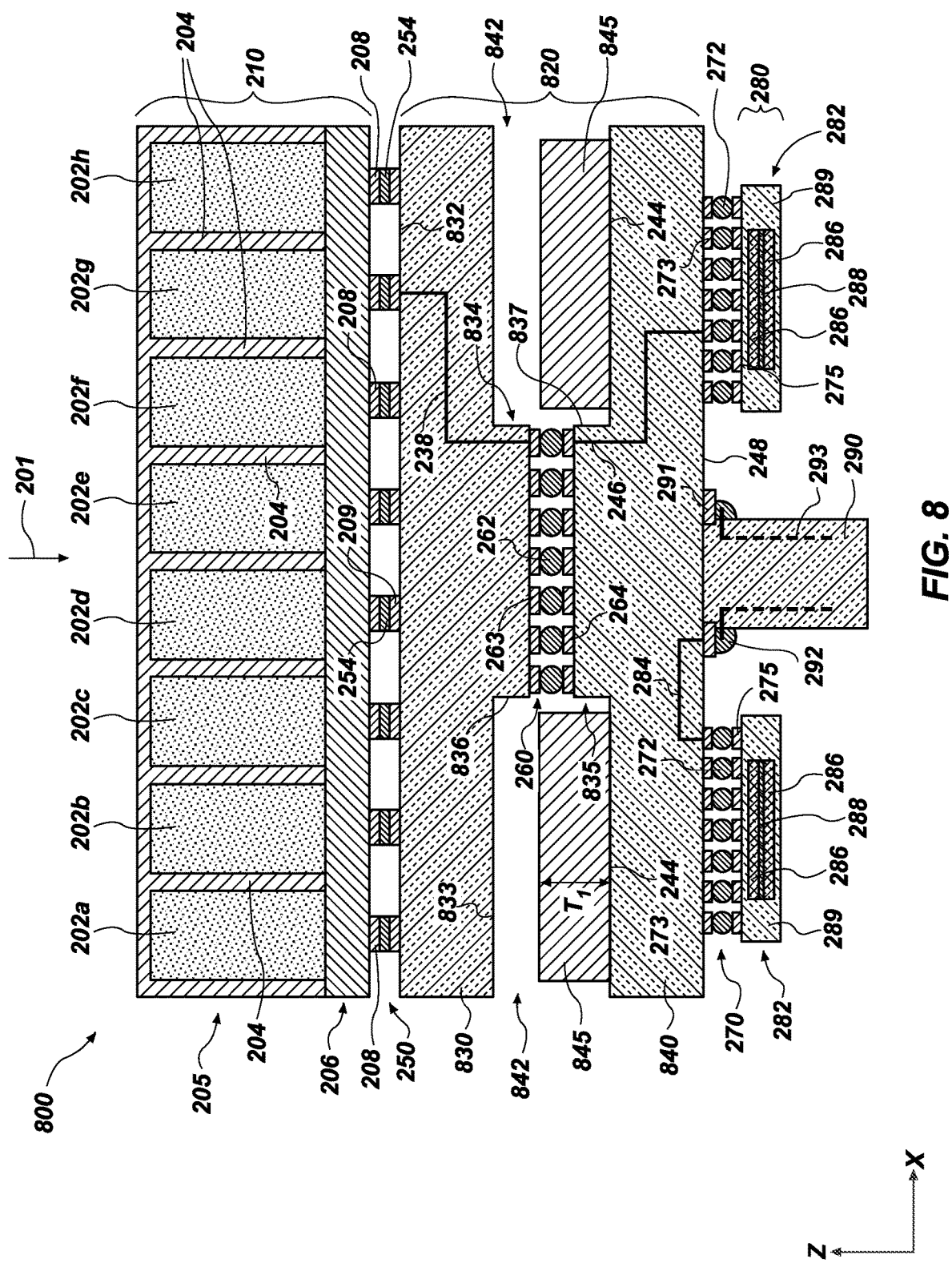
FIG. 8 is a simplified partial cross-sectional view of another detector tile, in accordance with other embodiments of the disclosure.

In other embodiments, each of the first substrate and the second substrate may include a protruding portion to define one or more cavities. FIG. 8 is a simplified partial cross-sectional view of a detector tile 800, in accordance with embodiments of the disclosure. The detector tile 800 includes a routing sub-assembly 820 including a first substrate 830 including a protruding portion 834 electrically connected to a second substrate 840, the second substrate 840 including an additional protruding portion 835.

The first substrate 830 may include an upper surface 832 and a lower surface 833. The upper surface 832 may be substantially planar, as described above with reference to the upper surface 732 (FIG. 7). The lower surface 833 may at least partially define the protruding portion 834 and cavities 842 between the first substrate 830 and the second substrate 840. At least portions of the cavities 842 are defined by sidewalls 836 of the protruding portion 834 and sidewalls 837 of the additional protruding portion 835. The first substrate 830 is coupled to the second substrate 840 by the second interconnection layer 860.

As illustrated in FIG. 8, in some embodiments, the second interconnection layer 260 may be located within vertical boundaries defined by the radiation shields 845.

The second substrate 840 includes the additional protruding portion 835. The additional protruding portion 835 includes sidewalls 837 at least partially defining the cavities 842 between the first substrate 830 and the second substrate 840. Radiation shields 845 may be disposed between the first substrate 830 and the second substrate 840 within the cavities 842.

Although the ASIC packages 282 (FIG. 2A, FIG. 2C, FIG. 6A, FIG. 6B, FIG. 7, FIG. 8), 582 (FIG. 5A, FIG. 5B) have been described and illustrated as having a particular configuration, such as a particular number of semiconductor dice 286 and the dielectric material 288, the disclosure is not so limited. FIG. 9A is a simplified partial cross-sectional view of an ASIC package 900, in accordance with embodiments of the disclosure. The ASIC package 900 may replace any of the ASIC packages 282, 582 of the detector tiles 200 (FIG. 2B), 500 (FIG. 5A), 600 (FIG. 6A), 700 (FIG. 7), 800 (FIG. 8) described herein. The ASIC package 900 may include a single semiconductor die 286 disposed within the package material 289.

FIG. 9B is a simplified partial cross-sectional view of an ASIC package 910, in accordance with embodiments of the disclosure. The ASIC package 900 may replace any of the ASIC packages 282, 582 of the detector tiles 200 (FIG. 2B), 500 (FIG. 5A), 600 (FIG. 6A), 700 (FIG. 7), 800 (FIG. 8) described herein. The ASIC package 910 may include two semiconductor dice 286 disposed within the package material 289. In some embodiments, the semiconductor dice 286 are vertically aligned with each other.

Any of the detector tiles 200 (FIG. 2B), 500 (FIG. 5A), 600 (FIG. 6A), 700 (FIG. 7), 800 (FIG. 8) may include ASIC packages including one semiconductor die 286 as described above with reference to FIG. 9A and the ASIC package 900, two semiconductor dice 286 as described above with reference to the ASIC packages 282 (FIG. 2A) and 910 (FIG. 9B), or four semiconductor dice 286, as described above with reference to the ASIC package 582 (FIG. 5A, FIG. 6A, FIG. 7, FIG. 8).

Accordingly, in some embodiments the radiation detector tiles 200 (FIG. 2A, FIG. 2C), 500 (FIG. 5A, FIG. 5B), 600 (FIG. 6A, FIG. 6B), 700 (FIG. 7), 800 (FIG. 8) may include one or more ASIC packages 282 (FIG. 2A, FIG. 2C, FIG. 6A, FIG. 6B, FIG. 7, FIG. 8), 582 (FIG. 5A, FIG. 5B), 900 (FIG. 9A), 910 (FIG. 9B). In some embodiments, the detector tiles 200, 500, 600, 700, 800 include four ASIC packages. In other embodiments, the detector tiles 200, 500, 600, 700, 800 include a greater number of ASIC packages, such as more than four (4) ASIC packages, more than five (5) ASIC packages, or more than six (6) ASIC packages.

In some embodiments, the radiation detector tiles 200 (FIG. 2A, FIG. 2C), 500 (FIG. 5A, FIG. 5B), 600 (FIG. 6A, FIG. 6B), 700 (FIG. 7), 800 (FIG. 8) include different number of radiation shields 245 (FIG. 2A, FIG. 4B), 545 (FIG. 5A, FIG. 5B), 645 (FIG. 6A, FIG. 6B), 745 (FIG. 7), 845 (FIG. 8) than those illustrated. In some embodiments, the detector tiles 200, 500, 600, 700, 800 include one radiation shield per ASIC package 282 (FIG. 2A, FIG. 2C, FIG. 6A, FIG. 6B, FIG. 7, FIG. 8), 582 (FIG. 5A, FIG. 5B), 900 (FIG. 9A), 910 (FIG. 9B). In other embodiments, the detector tiles 200, 500, 600, 700, 800 may include fewer radiation shields than ASIC packages, such as two radiation shields and four ASIC packages or six ASIC packages.

Accordingly, radiation scanning systems according to embodiments described herein may include one or more radiation tiles comprising a radiation detection sub-assembly and a routing sub-assembly connected to the radiation detection sub-assembly and configured to electrically couple the radiation detection sub-assembly to an electronics sub-assembly. The routing sub-assembly includes a first substrate coupled to the radiation detection sub-assembly and a second substrate coupled to the first substrate and the electronics sub-assembly. One or more cavities defined by surfaces of the first substrate and the second substrate are located between the first substrate and the second substrate. One or more radiation shields are disposed in the one or more cavities and configured to reduce impingent radiation from damaging the components of the electronics sub-assembly. The size and shape of the first substrate and the second substrate facilitate forming the radiation shields between the first substrate and the second substrate and routing electronic circuitry through the first substrate and the second substrate.

While embodiments of the disclosure may be susceptible to various modifications and alternative forms, specific embodiments have been shown by way of example in the drawings and have been described in detail herein. However, it should be understood that the disclosure is not limited to the particular forms disclosed. Rather, the disclosure encompasses all modifications, variations, combinations, and alternatives falling within the scope of the disclosure as defined by the following appended claims and their legal equivalents.

What is claimed is:

1. A radiation scanning system, comprising:
    a radiation detection sub-assembly;
    a routing sub-assembly coupled to the radiation detection sub-assembly, the routing sub-assembly comprising:
        a first substrate electrically connected to the radiation detection sub-assembly; and
        a second substrate electrically connected to the first substrate;
    one or more radiation shields between the first substrate and the second substrate, the one or more radiation shields contacting one of the first substrate and the second substrate and separated from the other of the first substrate and the second substrate by an air gap; and
    one or more semiconductor dice electrically connected to the second substrate on a side of the second substrate opposite the first substrate.

2. The radiation scanning system of claim 1, wherein the first substrate comprises a protrusion defining at least a portion of a bottom surface of the first substrate, sidewalls of the protrusion at least partially defining one or more cavities in which the one or more radiation shields are disposed.

3. The radiation scanning system of claim 2, wherein a height of the protrusion is greater than a thickness of the one or more radiation shields.

4. The radiation scanning system of claim 1, wherein an upper surface of the second substrate is spaced from a surface of the one or more radiation shields.

5. The radiation scanning system of claim 1, wherein the one or more semiconductor dice are located within lateral boundaries defined by the one or more radiation shields.

6. The radiation scanning system of claim 1, wherein the one or more radiation shields comprises four radiation shields.

7. The radiation scanning system of claim 1, wherein:
    the first substrate comprises one or more protrusions around a periphery thereof; and
    the one or more radiation shields are disposed in one or more cavities defined at least partially by the one or more protrusions and an upper surface of the second substrate.

8. The radiation scanning system of claim 1, wherein the radiation detection sub-assembly comprises a photodiode diode coupled to a scintillator array.

9. The radiation scanning system of claim 1, wherein the one or more semiconductor dice are disposed within one or more ASIC packages.

10. The radiation scanning system of claim 1, wherein the one or more semiconductor dice each individually comprises a flip chip semiconductor die.

11. The detector array of claim 10, wherein the first substrate comprises a ceramic material.

12. A detector array for a radiation system, the detector array comprising:
    a first substrate coupled to a radiation detection sub-assembly;
    a second substrate vertically underlying the first substrate, the first substrate comprising a protrusion extending between the first substrate and the second substrate;
    conductive structures between the first substrate and the second substrate and electrically connecting the first substrate and the second substrate, the conductive structures coupled to the protrusion; and
    one or more radiation shields within one or more cavities between the first substrate and the second substrate.

13. The detector array of claim 12, wherein the one or more radiation shields are external to the first substrate and the second substrate.

14. The detector array of claim 12, wherein the one or more radiation shields are coupled to the first substrate with an electrically conductive adhesive.

15. The detector array of claim 12, wherein the protrusion exhibits a cross-shaped horizontal cross-section.

16. A radiation scanning system, comprising:
    a radiation detection sub-assembly comprising:
        a scintillator array; and
        a photodiode array coupled to the scintillator array;
    a routing sub-assembly comprising:
        a first substrate coupled to the photodiode array with first conductive structures, the first substrate comprising a protrusion extending in a direction opposite the photodiode array;
        a second substrate coupled to the first substrate with second conductive structures; and
        one or more radiation shields between the first substrate and the second substrate, the one or more radiation shields laterally spaced from the protrusion; and
    an electronics sub-assembly comprising:
        one or more semiconductor dice coupled to the second substrate with third conductive structures; and
        a connector configured to electrically couple to a detector module.

17. The radiation scanning system of claim 16, wherein the one or more radiation shields comprise a single radiation shield vertically overlying two or more semiconductor dice.

18. The radiation scanning system of claim 16, wherein a lower surface of the one or more radiation shields is closer to an upper surface of the first substrate than a lower surface of the protrusion.

19. The radiation scanning system of claim 16, wherein the second substrate comprises an additional protrusion extending in a direction opposite the electronics sub-assembly.

20. The radiation scanning system of claim 19, wherein the second conductive structures are directly between the protrusion of the first substrate and the additional protrusion of the second substrate.

* * * * *